(12) United States Patent
Royak et al.

(10) Patent No.: US 9,318,944 B2
(45) Date of Patent: Apr. 19, 2016

(54) METHODS AND APPARATUS FOR ACTIVE FRONT END FILTER CAPACITOR DEGRADATION DETECTION

(71) Applicants: Semyon Royak, Orange Village, OH (US); Robert J. Breitzmann, South Russell, OH (US)

(72) Inventors: Semyon Royak, Orange Village, OH (US); Robert J. Breitzmann, South Russell, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 246 days.

(21) Appl. No.: 13/872,177

(22) Filed: Apr. 29, 2013

(65) Prior Publication Data
US 2014/0320056 A1 Oct. 30, 2014

(51) Int. Cl.
| | |
|---|---|
| *H02M 7/797* | (2006.01) |
| *H02P 27/06* | (2006.01) |
| *H02M 1/12* | (2006.01) |
| *H02M 5/44* | (2006.01) |
| *G01R 31/42* | (2006.01) |
| *G01R 31/02* | (2006.01) |

(52) U.S. Cl.
CPC .............. *H02M 1/126* (2013.01); *H02M 7/797* (2013.01); *H02P 27/06* (2013.01); *G01R 31/028* (2013.01); *G01R 31/42* (2013.01)

(58) Field of Classification Search
USPC .......... 318/504, 400.31, 400.33; 363/44, 126; 324/548; 307/82
See application file for complete search history.

(56) References Cited

U.S. PATENT DOCUMENTS

| | | | | |
|---|---|---|---|---|
| 4,419,621 A | * | 12/1983 | Becker | ................... H02H 3/365 324/548 |
| 5,319,513 A | | 6/1994 | Lowenstein et al. | |

(Continued)

FOREIGN PATENT DOCUMENTS

| | | |
|---|---|---|
| CN | 201393056 Y | 1/2010 |
| EP | 2299568 A1 | 3/2011 |

(Continued)

OTHER PUBLICATIONS

European Search Report, EP14166343.5, Mailed Feb. 12, 2015, Completed Feb. 4, 2015, The Hague.

(Continued)

*Primary Examiner* — Paul Ip
*Assistant Examiner* — Said Bouziane
(74) *Attorney, Agent, or Firm* — Fay Sharpe LLP

(57) ABSTRACT

Apparatus and methods are provided for detecting degradation of delta-connected filter capacitors in an active front end (AFE) power converter, in which delta circuit capacitor leg currents are calculated based on measured branch circuit currents, and filter capacitor impedance values are computed based on the calculated leg currents as well as measured line-to-line voltages and corresponding phase angles for comparison with one or more thresholds to selectively detect degradation of the filter capacitors. Further apparatus and methods are provided for detecting degradation of Y-connected filter capacitors by computation of fundamental frequency RMS impedance values as ratios of RMS capacitor voltages and RMS circuit branch currents, and comparison of the calculated RMS impedance values with one or more thresholds.

20 Claims, 10 Drawing Sheets

(56) References Cited

U.S. PATENT DOCUMENTS

| | | |
|---|---|---|
| 5,491,725 A | 2/1996 | White |
| 5,796,258 A | 8/1998 | Yang |
| 5,804,973 A | 9/1998 | Sinohara |
| 6,166,929 A | 12/2000 | Ma et al. |
| 6,269,010 B1 | 7/2001 | Ma et al. |
| 6,366,483 B1 | 4/2002 | Ma et al. |
| 6,525,951 B1 | 2/2003 | Paice |
| 6,642,689 B2 | 11/2003 | Ishida et al. |
| 7,274,576 B1 | 9/2007 | Zargari et al. |
| 7,495,410 B2 | 2/2009 | Zargari et al. |
| 7,495,938 B2 | 2/2009 | Wu et al. |
| 7,511,976 B2 | 3/2009 | Zargari et al. |
| 7,616,005 B2 | 11/2009 | Kalyuzhny et al. |
| 7,683,568 B2 | 3/2010 | Pande et al. |
| 7,764,523 B2 | 7/2010 | Conticelli et al. |
| 7,782,009 B2 | 8/2010 | Wiseman |
| 7,786,735 B2 | 8/2010 | Kalyuzhny et al. |
| 7,800,348 B2 | 9/2010 | Zargari |
| 7,812,615 B2 | 10/2010 | Gajic et al. |
| 7,990,097 B2 | 8/2011 | Cheng et al. |
| 8,009,450 B2 | 8/2011 | Royak et al. |
| 8,030,791 B2 | 10/2011 | Lang et al. |
| 8,044,631 B2 | 10/2011 | Dai et al. |
| 8,183,874 B2 | 5/2012 | Dommaschk |
| 8,259,426 B2 | 9/2012 | Xiao et al. |
| 8,259,480 B2 | 9/2012 | Hasler |
| 8,350,397 B2 | 1/2013 | Lang et al. |
| 8,352,203 B2 | 1/2013 | Seibel et al. |
| 8,395,910 B2 | 3/2013 | Alexander |
| 8,400,800 B2 | 3/2013 | Alexander |
| 8,587,160 B2 | 11/2013 | Dai et al. |
| 8,729,844 B2 | 5/2014 | Feng et al. |
| 2001/0017489 A1 | 8/2001 | Inoue et al. |
| 2004/0257093 A1 | 12/2004 | Sakiyama |
| 2009/0072982 A1 | 3/2009 | Cheng et al. |
| 2010/0161259 A1 | 6/2010 | Kim et al. |
| 2011/0292696 A1* | 12/2011 | Xiao et al. .............. 363/37 |
| 2012/0194202 A1* | 8/2012 | Xiao .............. H02H 7/1203 324/548 |
| 2012/0271572 A1 | 10/2012 | Xiao |
| 2013/0057297 A1 | 3/2013 | Cheng |
| 2013/0076151 A1* | 3/2013 | Bae .............. H02M 1/126 307/82 |
| 2013/0120038 A1 | 5/2013 | Kerkman et al. |
| 2013/0120039 A1 | 5/2013 | Kerkman et al. |
| 2013/0279214 A1 | 10/2013 | Takase et al. |
| 2013/0286692 A1 | 10/2013 | Patel et al. |
| 2014/0217980 A1 | 8/2014 | Malrieu |
| 2014/0320056 A1 | 10/2014 | Royak |
| 2015/0092460 A1 | 4/2015 | Tallam |
| 2015/0153397 A1 | 6/2015 | Kerkman et al. |
| 2015/0155794 A1 | 6/2015 | Long |
| 2015/0241503 A1 | 8/2015 | Bhandarkar |
| 2015/0263600 A1 | 9/2015 | Bhandarkar et al. |

FOREIGN PATENT DOCUMENTS

| | | |
|---|---|---|
| EP | 2 390 997 A2 | 11/2011 |
| EP | 2660962 A2 | 11/2013 |
| FR | 2980053 | 3/2011 |
| WO | WO2012010353 A1 | 1/2012 |
| WO | WO2012044727 A1 | 4/2012 |
| WO | WO2012110088 A1 | 8/2012 |

OTHER PUBLICATIONS

ABB Bay Control REC670 Application manual, Relion 670 series, http://www05./abb.com/global/scot/scot354.nsf, Oct. 10, 2011, pp. 1-586 (2 parts).

Transformer protection RET670 ANSI Application manual, Relion 670 series, http://www.abb.com/product/db0003db004281/c12573e700330419c/257f000263ad5.aspx#!, May 6, 2011, pp. 1-864 (2 parts).

"Protective Relays", iCP-630 Capacitor Bank Protection Relay, Cooper Power Systems, Jan. 2011, pp. 1-8.

ABB Distribution Automation Handbook, Section 8.10 Protection of Capacitor Banks, Mar. 5, 2011.

GE C70 Capacitor Bank Protection and Control System UR Series Instruction Manual C70 Revision: 6.0x, Copyright @ 2011, GE Multilin, http://www.GEmultilin.com, pp. 1-644 (2 parts).

"iCP-630 Capacitor Bank Protection Relay", Cooper Power Systems, Mar. 2007.

U.S. Appl. No. 13/570,781, "Filter Capacitor Degradation Detection Apparatus and Method", by Patel et al., filed Aug. 9, 2012.

European Search Report completed Jul. 20, 2015 for Application No. EP 15 15 6270.

Rodriguez-Valdez, et al., "Phase Locked Loop for Unbalanced Utility Conditions", 2010 Applied Power Electronics Conference and Exposition (APEC), 2010 25th Annual IEEE 2010, Piscataway, NJ, Feb. 21, 2010, pp. 634-641.

* cited by examiner

METHODS AND APPARATUS FOR ACTIVE FRONT END FILTER CAPACITOR DEGRADATION DETECTION

BACKGROUND

Motor drives and other power conversion systems operate using power from AC power sources, and typically include an input filter to reduce switching noise associated with operation of the power converter, and particularly to control total harmonic distortion (THD) generated by high frequency operation of certain active front end (AFE) rectifiers. In particular, many power conversion systems utilize inductor-capacitor (LC) or inductance-capacitance-inductance (LCL) input filter circuitry associated with each AC input phase to control the harmonic content of a connected power grid. Such filter circuits are subject to damage or degradation of the filter capacitors. Filter capacitor degradation, in turn, may be costly in terms of replacement component costs, labor for inspection and replacement, as well as downtime for the power conversion system and any associated machinery. Thusfar, however, assessing the performance and any degradation in the input filter capacitors has been difficult, and initial capacitor degradation may not be identifiable by visual inspection by service personnel. Certain conventional power converters employ fuses in line with the filter circuit capacitors, but in practice the fuses either do not open quickly enough to prevent capacitor degradation or open frequently in normal operation with healthy capacitors, whereby excessive system downtime results. Accordingly, a need remains for improved filter capacitor degradation prediction or detection apparatus and techniques for use with an active front end power converters.

SUMMARY

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter. The present disclosure provides methods and apparatus for active front end (AFE) power converter filter capacitor degradation detection in which line-to-line voltage and circuit branch currents are measured, and delta-connected filter capacitor impedances are calculated and compared with one or more thresholds without requiring direct measurement of the capacitor currents. The disclosure thus presents a significant advance over conventional capacitor degradation prevention or detection techniques since no fuses are used and the onset of degradation can be assessed prior to system damage. The detected degradation condition can be used, in turn, to provide a system alert or warning and/or to shut down the power conversion system.

A power conversion system is disclosed, including an active front end rectifier and an input filter circuit including three series circuits with one or more associated filter inductors coupled between a corresponding system power input phase and a corresponding rectifier input phase. The filter circuit further includes three capacitor circuit branches individually connected to one of the corresponding series circuits, as well as three filter capacitors connected in a delta configuration. A feedback circuit senses line-to-line voltages across the filter capacitors, as well as filter circuit branch currents. The power converter further includes a degradation detection system that calculates fundamental frequency filter capacitor impedance values based at least partially on the line-to-line voltages and the filter circuit branch currents, and selectively detects degradation of one or more of the filter capacitors according to the calculated impedance values.

In certain implementations, the individual series circuits of the input filter circuit include first and second filter inductors, with the individual capacitor circuit branches being connected to the node joining the first and second filter inductors of the corresponding series circuit. The detection system in certain implementations filters the line-to-line voltage and the filter circuit branch currents to obtain values at the input power fundamental frequency, and calculates RMS values for use in determining the fundamental frequency filter capacitor impedance values. In certain embodiments, moreover, the system uses formulas for calculating the capacitor impedances which incorporate a ratio determined according to an artificial resistive circuit connected in a delta configuration, such that the formulas involve only the fundamental frequency RMS line-to-line voltages and filter circuit branch current values, as well as phase angles between the line-to-line voltages. In certain implementations, for example, the system includes a zero-crossing detection circuit to measure the phase angles between the voltages, or the phase angles may be assumed (e.g., 120° and 240°).

A method is provided for detecting filter capacitor degradation in a motor drive in accordance with further aspects of the disclosure, including measuring line-to-line voltages across delta-connected filter capacitors as well as measuring filter circuit branch current values. The method further includes calculating fundamental frequency filter capacitor impedance values according to the measured voltages and currents, and comparing the calculated capacitor impedances with at least one threshold. Degradation of one or more of the filter capacitors is selectively detected at least partially according to the comparison of the calculated impedance values with the threshold. Certain embodiments of the method include issuing an alert or shutting down the motor drive based on the threshold comparison. In certain embodiments, moreover, the method includes filtering the measured voltages and currents to obtain filtered values at the AC input fundamental frequency, as well as computing RMS values for calculating the fundamental frequency filter capacitor impedance values.

Further aspects of the present disclosure provide apparatus and techniques for detecting degradation of Y-connected filter capacitors, in which capacitor voltages are sensed, such as between a branch circuit and a common connection point of the Y-connected filter capacitors, and the voltages are filtered to provide fundamental frequency capacitor voltage values, and RMS values are computed therefrom. Likewise, the filter branch circuit currents flowing through the filter capacitors are measured and fundamental frequency RMS values thereof are obtained. The filter capacitor impedance values are then calculated as a ratio of the fundamental frequency RMS voltage to the fundamental frequency RMS current, and the resulting calculated filter capacitor impedance values are compared with one or more thresholds for selective detection of filter capacitor degradation.

In accordance with further aspects of the present disclosure, computer readable mediums are provided with computer executable instructions for performing the filter capacitor degradation detection methods.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
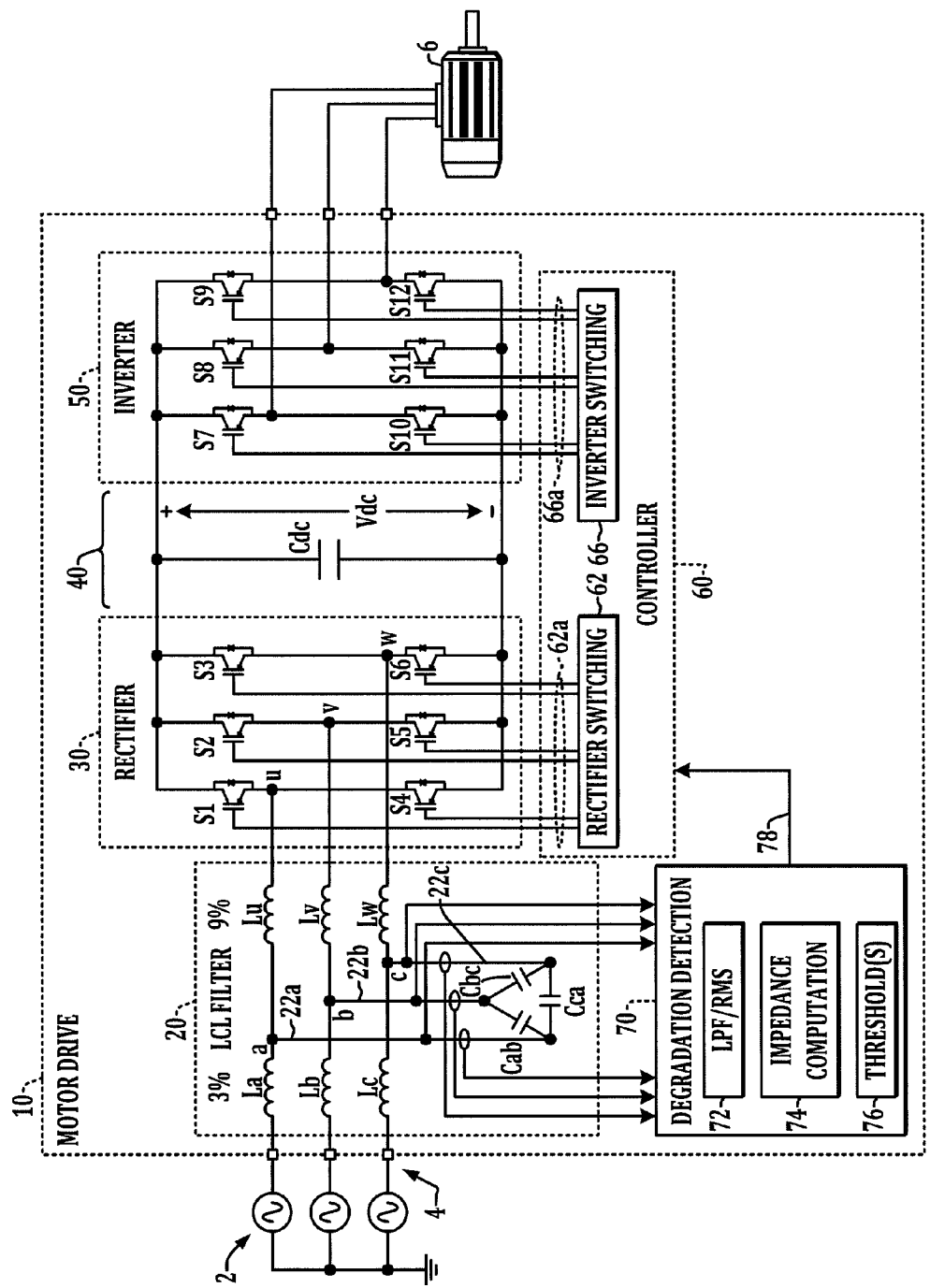
FIG. 1 is a schematic diagram illustrating an exemplary active front end (AFE) motor drive with an input LCL filter including delta-connected filter capacitors as well as filter capacitor degradation detection apparatus in accordance with one or more aspects of the present disclosure.

Referring now to the figures, several embodiments or implementations are hereinafter described in conjunction with the drawings, wherein like reference numerals are used to refer to like elements throughout, and wherein the various features are not necessarily drawn to scale. Techniques and apparatus are disclosed for detection of degradation in power conversion system filter capacitors connected in a delta configuration. These aspects of the disclosure find utility in association with active front end (AFE) motor drives as well as other forms of power conversion systems. In addition, although illustrated in the context of a three-phase input devices, the disclosed concepts can be employed in power conversion systems having any number of input phases in which an input filter includes at least one delta-connected filter capacitor circuit.

The disclosed techniques and apparatus advantageously facilitate computation and monitoring of input filter capacitor values (i.e., capacitance) and changes therein to predict or detect component degradation without requiring direct measurement of current flowing through the monitored capacitors. In this regard, packaging and other physical constraints may, in some systems, prevent incorporation of direct current sensors in the delta circuit branch legs, and/or provision of such sensors may be cost prohibitive. Using the disclosed techniques, however, the current flowing into branches connected to the delta configuration of three filter capacitors can be used along with measured line-to-line voltages across the filter capacitors and measured or assumed voltage phase angles for computation of the individual filter capacitance values. With these, a comparison can be made with one or more threshold values in order to assess potential degradation of the individual filter capacitors, and a determination can be made as to whether one or more of these components are degrading. The degradation detection, moreover, can be used to initiate any appropriate remedial or reporting action. In this manner, the present disclosure avoids the over inclusive or under inclusive nature of protective fuses previously used in line with filter capacitors, and also advantageously facilitates early identification of the onset of component degradation in delta-connected input filter capacitors. This, in turn, can be used to minimize system downtime and reduce or mitigate maintenance costs associated with a motor drive or other power conversion system.

Figure 2:
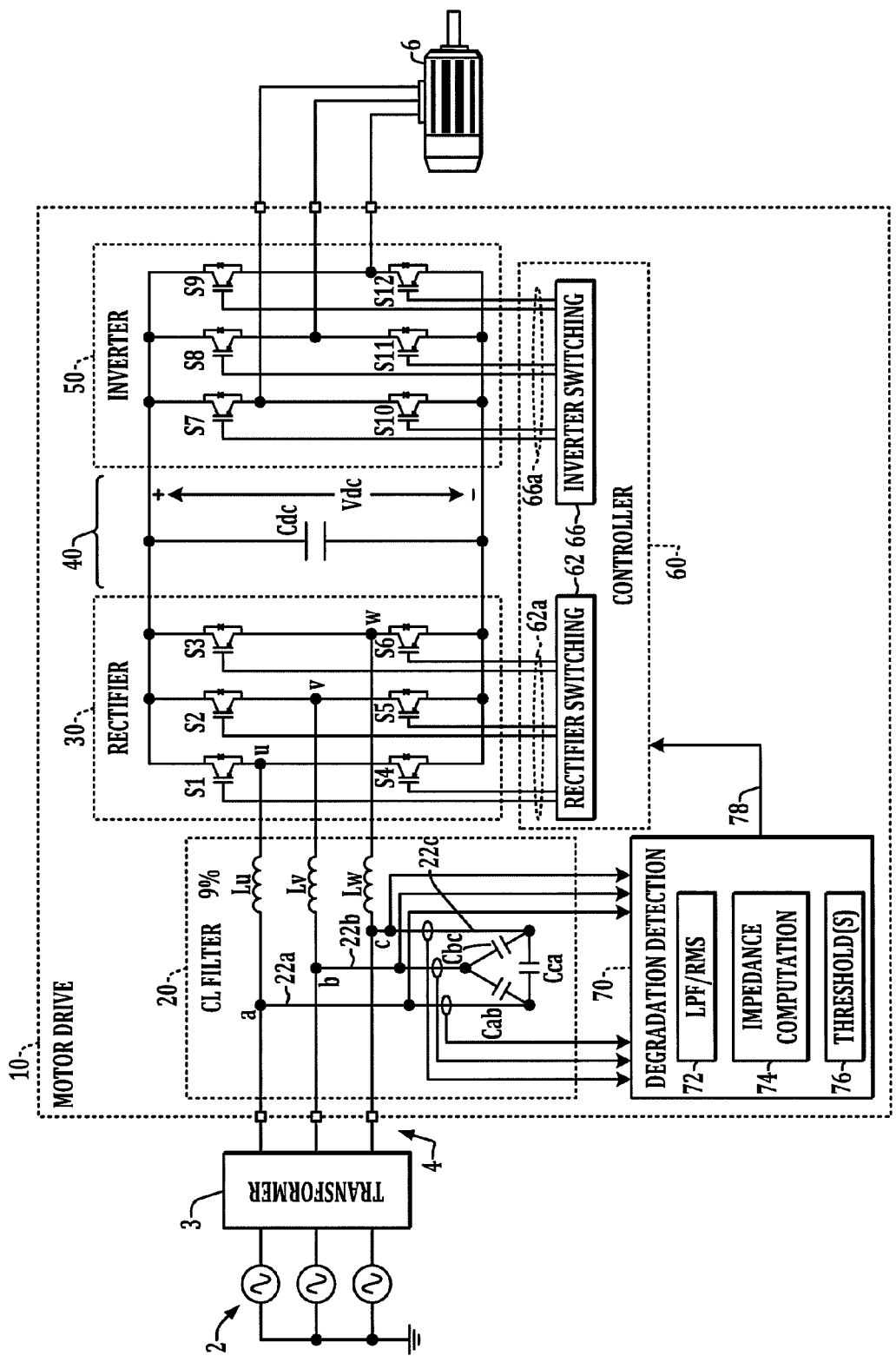
FIG. 2 is a schematic diagram illustrating another AFE motor drive connected to a power source through a transformer, including a CL input filter with delta-connected filter capacitors and filter capacitor degradation detection apparatus according to the present disclosure.

Referring initially to FIGS. 1 and 2, FIG. 1 illustrates an exemplary motor drive 10 with a three phase AC input 4 receiving input power from a three-phase source 2, where the drive 10 includes a rectifier 30, an intermediate DC link circuit 40 and an output inverter 50 providing variable frequency, variable amplitude AC output power to drive a motor load 6. Although illustrated and described in the context of a motor drive type power conversion system 10, the various disclosed concepts can be employed in other forms of power conversion systems, whether providing an AC output or a DC output to drive a motor or other type of load. The drive input 4 has three input phase terminals which are connected through an LCL input filter circuit 20 to the AC input of the switching (active front end) rectifier 30. The switching rectifier 30 includes switching devices S1-S6 individually coupled between a corresponding one of the AC input phases (u, v, w) and a corresponding DC bus terminal (+ or −) of the DC link circuit 40. A drive controller 60 includes a rectifier switching controller 62 that provides rectifier switching control signal 62a to the rectifier switches S1-S6 to cause the rectifier 30 to convert received three-phase AC input power to provide a DC voltage Vdc across a DC bus capacitance Cdc of the link circuit 40 using any suitable pulse width modulation (PWM) technique. The inverter 50 receives DC input power from the link circuit 40 and includes inverter switches S7-S12 individually coupled between one of the positive or negative DC bus terminals and a corresponding output phase connected to the motor load 6. The inverter switches S7-S12 are operated according to inverter switching control signals 66a provided by an inverter switching component 66 of the drive controller 60, which generates the signals 66a according to any suitable pulse width modulation technique to convert DC power from the link circuit 40 to provide variable frequency, variable amplitude AC output power to the motor load 6. The switching rectifier 30 and the inverter 50 may employ any suitable form of switching devices S1-S12 including without limitation insulated gate bipolar transistors (IGBTs), silicon controlled rectifiers (SCRs), gate turn-off thyristors (GTOs), integrated gate commutated thyristors (IGCTs), etc.

As seen in the example of FIG. 1, the LCL filter circuit 20 includes three series circuits individually connected between the power converter input 4 and the corresponding phase of the rectifier AC input. Each series circuit includes a pair of series-connected filter inductors, with the first circuit including inductor La (e.g., a 3% inductor) connected between the first power converter input terminal and a first intermediate node "a", as well as a second filter inductor (e.g., a 9% inductor) Lu connected between the intermediate node a and a first rectifier AC input node "u". Similarly, the second series circuit includes a first inductor Lb connected between the second motor drive input and a second intermediate node "b" and a second inductor Lv connected between the node b and the second rectifier input "v", as well as a third series circuit with first and second inductors Lc and Lw joined by a third intermediate node "c". In addition, the filter circuit 20 includes three capacitor circuit branches 22a, 22b and 22c respectively connecting the nodes a, b and c to a delta configuration of three filter capacitors Cab, Cbc and Cca. In this delta-connected capacitor circuit, each filter capacitor C is connected to two of the capacitor circuit branches 22 as shown.

FIG. 2 illustrates an alternate embodiment in which a CL filter circuit 20 is provided for interfacing the motor drive 10 with the power source 2 through a transformer 3. In this example, the first filter inductors La, Lb and Lc are omitted due to the inductance of the secondary windings of the transformer 3, and the input terminals 4 are connected directly to the inductors Lu, Lv and Lw at the nodes a, b and c, respectively.

As seen in FIGS. 1 and 2, moreover, the motor drive 10 includes a degradation detection system 70 coupled with the filter circuit 20, as well as a feedback circuit which senses line-to-line voltages $V_{c.ab}$, $V_{c.bc}$ and $V_{c.ca}$ across the filter capacitors Cab, Cbc and Cca, for example, by sensing the voltages at the branch circuits 22 as illustrated. In addition, the feedback circuit includes current sensors coupled to the branch circuits 22 to sense the filter circuit branch currents $I_{c.a}$, $I_{c.b}$ and $I_{c.c}$ flowing in the associated capacitor circuit branches 22a, 22b and 22c. The degradation detection system 70 can be any suitable hardware, processor-executed software, processor-executed firmware, programmable logic, analog circuitry, etc. which provides the described filtering, RMS computations, impedance computations and threshold comparison functionality as set forth herein, and may be operative using one or more processor elements executing computer executable instructions stored in an electronic memory of the system 70. As seen in FIGS. 1 and 2, the degradation detection system 70 may include one or more components, which may be implemented as software and/or firmware components in execution, programmable logic, etc., including a low pass filter/RMS computation component 72, an impedance computation component 74, as well as comparison logic operating to compare one or more computer calculated values to one or more thresholds 76. In addition, the degradation detection system 70 may provide a detection output signal or value 78 indicating that degradation of one or more of the filter capacitors Cab, Cbc and/or Cca has been detected by the system 70. In one implementation, as illustrated, the degradation detection signal 78 may be provided to the motor drive controller 60 to initiate one or more actions, such as shutting down the motor drive 10 and/or providing an alert or warning signal or other indication, for instance, to a user interface associated with the motor drive 10 and/or to a connected network (not shown).

In operation, the degradation detection system 70 is configured to calculate fundamental frequency filter capacitor impedance values $Z_{ab.60Hz}$, $Z_{bc.60Hz}$ and $Z_{ca.60Hz}$ based at least in part on the measured line-to-line voltages $V_{c.ab}$, $V_{c.bc}$ and $V_{c.ca}$ and according to the sensed filter circuit branch currents $I_{c.a}$, $I_{c.b}$ and $I_{c.c}$. In addition, the system 70 selectively detects degradation of one or more of the filter capacitors Cab, Cbc and/or Cca according to the calculated fundamental frequency filter capacitor impedance values $Z_{ab.60Hz}$, $Z_{bc.60Hz}$ and $Z_{ca.60Hz}$. For example, certain implementations of the detection system 70 individually compare the capacitor impedance values $Z_{ab.60Hz}$, $Z_{bc.60Hz}$ and $Z_{ca.60Hz}$ to one or more threshold values 76, such as a lower threshold value 76 representing a nominal capacitance value minus a certain percentage as well as an upper threshold value 76 representing the nominal capacitance plus another percentage (e.g., 5-8% in one implementation) representing manufacturing tolerances, temperature drift effects, component age effects, etc. If the calculated fundamental frequency impedance value $Z_{.60Hz}$ of any one of the capacitors Cab, Cbc and/or Cca goes below the lower threshold or above the upper threshold, the system 70 provides the detection signal 78 to initiate a user alarm or alert and/or to shut down the motor drive 10.

In certain implementations, the system 70 includes one or more hardware and/or processor-executed software type filters 72 which filter the line-to-line voltages $V_{c.ab}$, $V_{c.bc}$ and $V_{c.ca}$ and the filter circuit branch currents $I_{c.a}$, $I_{c.b}$ and $I_{c.c}$ to obtain filtered line-to-line voltages $V_{c.ab.60hz}$, $V_{c.bc.60hz}$ and $V_{c.ca.60hz}$ and filtered circuit branch currents $I_{c.a.60hz}$, $I_{c.b.60hz}$ and $I_{c.c.60hz}$ at a fundamental frequency of the multiphase AC input power. For example, the LPF/RMS component 72 may include a low pass and/or bandpass filter or combinations thereof of any suitable order or filter type to remove frequencies above the AC input power fundamental frequency (e.g., 60 Hz in one example). For example, certain implementations employ a second order Butterworth low pass filter with a cutoff frequency of about 80 Hz to obtain the filtered line-to-line voltages $V_{c.ab.60hz}$, $V_{c.bc.60hz}$ and $V_{c.ca.60hz}$ and filtered circuit branch currents $I_{c.a.60hz}$, $I_{c.b.60hz}$ and $I_{c.c.60hz}$.

The component 72 also calculates RMS line-to-line voltages $V_{c.ab.60hz.RMS}$, $V_{c.bc.60hz.RMS}$ and $V_{c.ca.60hz.RMS}$ according to the filtered line-to-line voltages $V_{c.ab.60hz}$, $V_{c.bc.60hz}$ and $I_{c.ca.60hz}$ and calculates RMS circuit branch currents $I_{c.a.60hz.RMS}$, $I_{c.b.60hz.RMS}$ and $I_{c.c.60hz.RMS}$ according to the filtered circuit branch currents $I_{c.a.60hz}$, $I_{c.b.60hz}$ and $I_{c.c.60hz}$. The RMS computations can be according to any suitable root-mean-square formulas as are known, such as calculating the square root of the mean of the squares of a series of sampled values of the filtered voltage or current value (e.g., at the fundamental frequency). Moreover, the illustrated embodiment of the degradation detection system 70 uses the impedance computation component 74 to calculate the fundamental frequency filter capacitor impedance values $Z_{ab.60Hz}$, $Z_{bc.60Hz}$ and $Z_{ca.60Hz}$ according to the fundamental frequency RMS line-to-line voltages $V_{c.ab.60hz.RMS}$, $V_{c.bc.60hz.RMS}$ and $V_{c.ca.60hz.RMS}$ and according to the fundamental frequency RMS circuit branch currents $I_{c.a.60hz.RMS}$, $I_{c.b.60hz.RMS}$ and $I_{c.c.60hz.RMS}$ as described further below.

Figure 3:
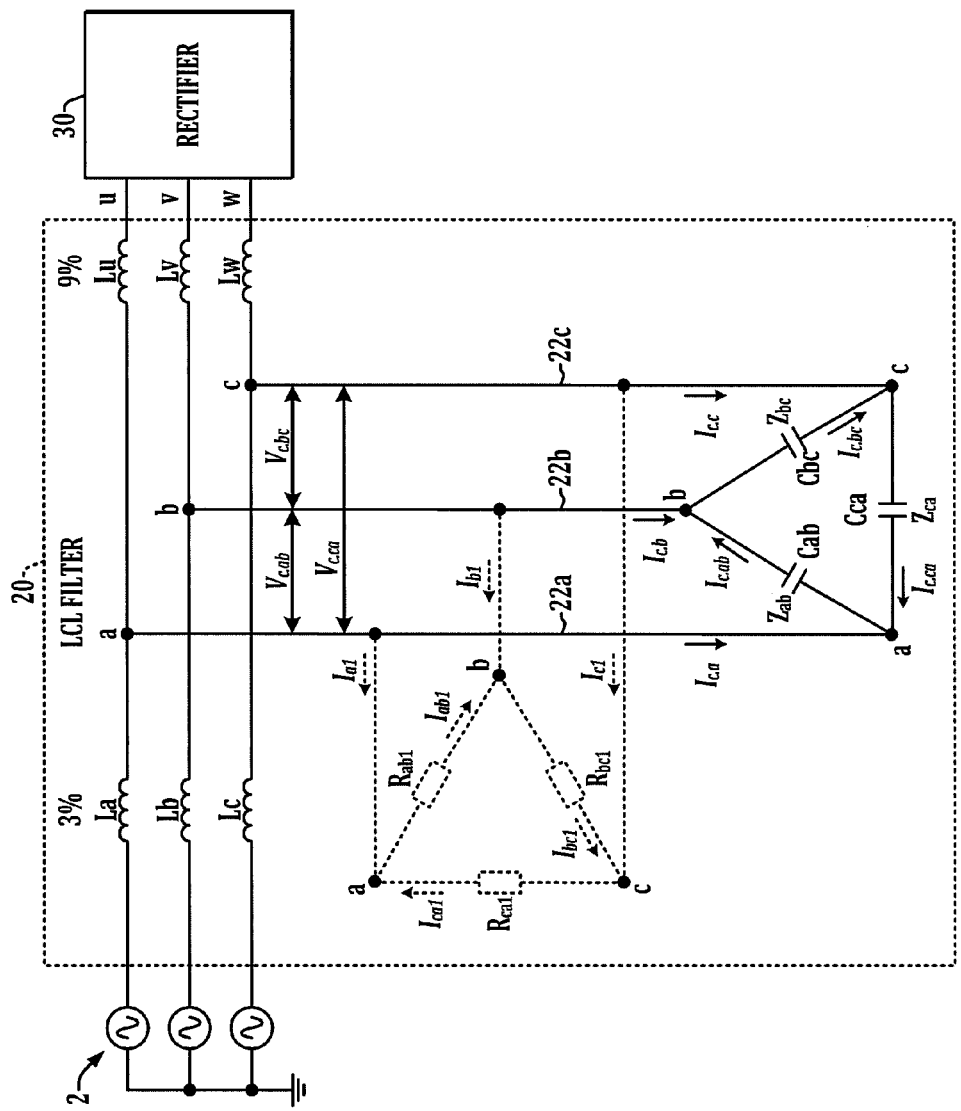
FIG. 3 is a schematic diagram further illustrating various measured and computed voltages and currents in the LCL filter of FIG. 1 as well as computation of leg and branch currents in an artificial delta-connected resistive circuit for computing a correction factor ratio in accordance with the present disclosure.

Referring also to FIG. 3, the exemplary system 70 advantageously employs a ratio type correction factor in the computation of the fundamental frequency filter capacitor impedance values, which is derived using an artificial resistive circuit shown connected to the capacitor circuit branches 22. Although this resistive circuit is not in fact provided in the motor drive 10 (illustrated instead in dashed-lines in FIG. 3), such a delta-connected resistor network including 1 ohm resistor elements Rab1, Rbc1 and Rca1 provides a useful forum for developing a correction factor used with respect to the delta-connected filter capacitors Cab, Cbc and Cca of the filter circuit 20. As seen in FIGS. 1-3, while the branch circuit currents $I_{c.a.}$, $I_{c.b}$ and $I_{c.c}$ can be directly measured by the feedback system of the motor drive 20 (along with the sensed line-to-line voltage values $V_{c.ab}$, $V_{c.bc}$ and $V_{c.ca}$), the leg circuit currents $I_{c.ab}$, $I_{c.bc}$ and $I_{c.ca}$ actually flowing through the individual capacitors Cab, Cbc and Cca in the delta configuration would require dedicated sensors, which would add cost to the system 10 and/or which may not be feasible in view of packaging requirements for the motor drive 10. Furthermore, the ability to accurately compute the leg circuit currents $I_{c.ab}$, $I_{c.bc}$ and $I_{c.ca}$ facilitates computation of the corresponding impedance values $Z_{ab}$, $Z_{bc}$ and $Z_{ca}$, of the filter capacitors Cab, Cbc and Cca by dividing the line-to-line voltages by the calculated leg circuit currents $I_{c.ab}$, $I_{c.bc}$ and $I_{c.ca}$.

In this regard, the inventors have appreciated that the best way to predict degradation of a capacitor is to monitor the capacitor impedance, such as by comparison by the impedance computation component 74 with one or more thresholds 76. Moreover, the impedance based on the fundamental frequency (e.g., 60 Hz) is preferred, since the presence of the filter circuit 20 within a switching power conversion system 10 leads to higher frequency harmonic content. For example, in an active front end motor drive, the fundamental frequency component will generally have the largest amplitude in a frequency spectrum, and the remainder of the significant harmonics (e.g., around 4 kHz and 8 kHz for a 4 kHz PWM switching frequency) will generally include a number of different harmonics close to one another, and are of generally lower amplitude, whereby it is more difficult to extract a signal for threshold comparison with respect to the higher order harmonics.

Moreover, for metallized polypropylene capacitors such as are often used in motor drive input filter circuits 20, the capacitance may vary a certain amount (e.g., +1.4% to −2.5%) over a relevant temperature range (e.g., −55° C. to +85° C.), in addition to an initial manufacturing tolerance of +/−3%, and a maximum tolerance over the operational lifetime of the capacitor component (aging tolerance), which factors can be considered in setting the threshold or thresholds 76 used for comparison with the computed filter capacitor impedance values $Z_{ab.60Hz}$, $Z_{bc.60Hz}$ and $Z_{ca.60Hz}$. In one possible implementation, and initial impedance value is determined (e.g., according to manufacturer's specifications, etc.), a lower threshold 76 is set as a first constant multiplied by the initial impedance value (e.g., 0.9 in one case), and the initial value is multiplied by a second constant (e.g., 1.1) to obtain the upper threshold 76.

The inventors have further appreciated that the delta configuration of the filter capacitors as shown in FIGS. 1-3, and the inability or undesirability of adding dedicated current sensors to measure the leg circuit currents $I_{c.ab}$, $I_{c.bc}$ and $I_{c.ca}$ actually flowing through the filter capacitors Cab, Cbc and Cca, can be mitigated or overcome by carefully adjusting or compensating calculations for the real leg circuit currents $I_{c.ab}$, $I_{c.bc}$ and $I_{c.ca}$ according to factors and/or parameters that can be directly measured and/or assumed. Specifically, as described below, the inventors have developed techniques for computing the leg circuit currents $I_{c.ab}$, $I_{c.bc}$ and $I_{c.ca}$ in terms of the sensed line-to-line voltages, the sensed branch circuit currents $I_{c.a}$, $I_{c.b}$ and $I_{c.c}$ as well as measured and/or assumed phase angles $\Phi_{bc}$ and $\Phi_{ca}$ between the line-to-line voltages $V_{c.ab}$ and $V_{c.bc}$ across the filter capacitors Cab, Cbc. Thus, the techniques and apparatus of the present disclosure overcome the inability or undesirability of additional dedicated filter capacitor current sensing, while providing the ability to accurately monitor the capacitance value of the filter capacitors Cab, Cbc and Cca for detection or early warning of capacitor degradation.

As seen in FIG. 3, the artificial delta-connected resistance circuit is coupled to the branch circuits 22a, 22b and 22c (as is the actual delta-connected filter capacitor circuitry). With respect to the RMS currents flowing in the actual filter capacitor circuit, the following equations (1) can be created according to Kirchhoffs current law at the three circuit nodes a, b and c:

$$\left. \begin{array}{l} I_{c.a.60hz.rms} = I_{c.ab.60hz.rms} + I_{c.ca.60hz.rms} \\ I_{c.b.60hz.rms} = I_{c.bc.60hz.rms} + I_{c.ab.60hz.rms} \\ I_{c.c.60hz.rms} = I_{c.ca.60hz.rms} + I_{c.bc.60hz.rms} \end{array} \right\} \quad (1)$$

From equation (1), the following equations (2)-(4) can be derived for calculated fundamental frequency RMS currents flowing in the capacitors Cab, Cbc and Cca:

$$I_{c.ab.60hz.rms.calc} = \frac{I_{c.a.60hz.rms} + I_{c.b.60hz.rms} - I_{c.c.60hz.rms}}{2} \quad (2)$$

$$I_{c.bc.60hz.rms.calc} = \frac{I_{c.b.60hz.rms} + I_{c.c.60hz.rms} - I_{c.a.60hz.rms}}{2} \quad (3)$$

$$I_{c.ca.60hz.rms.calc} = \frac{I_{c.c.60hz.rms} + I_{c.a.60hz.rms} - I_{c.b.60hz.rms}}{2} \quad (4)$$

However, the inventors have appreciated that equations (1)-(4) do not exactly represent Kirchhoffs current law for the nodes of the filter circuit because Kirchhoffs current law was not written for rms values, and thus the artificial resistive circuit shown in FIG. 3 is used to derive correction factors used by the impedance computation component 74 in the motor drive 10. The artificial resistive circuit of FIG. 3 demonstrates that the currents $I_{ab1}$, $I_{bc1}$, $I_{ca1}$ in the legs of the resistive delta-connected circuit can be measured, assuming that the artificial circuit resistors $R_{ab1}$, $R_{bc1}$, $R_{ca1}$ are known (e.g., 1 ohm to simplify the computations), and that the resistive circuit branch currents $I_{a1}$, $I_{b1}$, $I_{c1}$ can be measured. Using equations (2)-(4) above for calculating the artificial circuit currents $I_{ab1}$, $I_{bc1}$, $I_{ca1}$, the following equations (5)-(7) can be derived:

$$I_{ab1.60hz.rms.calc} = \frac{I_{a1.60hz.rms} + I_{b1.60hz.rms} - I_{c1.60hz.rms}}{2} \quad (5)$$

$$I_{bc1.60hz.rms.calc} = \frac{I_{b1.60hz.rms} + I_{c1.60hz.rms} - I_{a1.60hz.rms}}{2} \quad (6)$$

$$I_{ca1.60hz.rms.calc} = \frac{I_{c1.60hz.rms} + I_{a1.60hz.rms} - I_{b1.60hz.rms}}{2} \quad (7)$$

The real current in the delta-connected capacitor leg circuits can be computed using the following ratios set forth in equations (8)-(10):

$$Ratio_{ab} = \frac{I_{ab1.60hz.rms.real}}{I_{ab1.60hz.rms.calc}} \quad (8)$$

$$Ratio_{bc} = \frac{I_{bc1.60hz.rms.real}}{I_{bc1.60hz.rms.calc}} \quad (9)$$

$$Ratio_{ca} = \frac{I_{ca1.60hz.rms.real}}{I_{ca1.60hz.rms.calc}} \quad (10)$$

Using the ratios of equations (8)-(10), the real current in the delta-connected filter capacitors can be computed according to the following equations (11)-(13):

$$I_{c.ab.60hz.rms.real} = Ratio_{ab} \cdot I_{c.ab.60hz.rms.calc} \quad (11)$$

$$I_{c.bc.60hz.rms.real} = Ratio_{bc} \cdot I_{c.bc.60hz.rms.calc} \quad (12)$$

$$I_{c.ca.60hz.rms.real} = Ratio_{ca} \cdot I_{c.ca.60hz.rms.calc} \quad (13)$$

In addition, the fundamental frequency RMS filter capacitor impedances can be computed according to the following equations (14)-(16) as follows:

$$Z_{ab.60Hz} = \frac{V_{c.ab.60hz.rms}}{I_{c.ab.60hz.rms.real}} \quad (14)$$

$$Z_{bc.60Hz} = \frac{V_{c.bc.60hz.rms}}{I_{c.bc.60hz.rms.real}} \quad (15)$$

$$Z_{ca.60Hz} = \frac{V_{c.ca.60hz.rms}}{I_{c.ca.60hz.rms.real}} \quad (16)$$

As seen in FIG. 3, moreover, the leg currents in the artificial resistive network can be derived according to the following equations (17)-(19):

$$I_{ab1.60hz.real.1} = \frac{V_{c.ab.60hz.peak} \cdot \text{Sin}(\omega t)}{1} = V_{c.ab.60hz.peak} \cdot \text{Sin}(\omega t) \quad (17)$$

$$I_{bc1.60hz.real.1} = \frac{V_{c.bc.60hz.peak} \cdot \text{Sin}(\omega t - \varphi_{bc})}{1} = V_{c.bc.60hz.peak} \cdot \text{Sin}(\omega t - \varphi_{bc}) \quad (18)$$

$$I_{ca1.60hz.real.1} = \frac{V_{c.ca.60hz.peak} \cdot \text{Sin}(\omega t - \varphi_{ca})}{1} = V_{c.ca.60hz.peak} \cdot \text{Sin}(\omega t - \varphi_{ca}) \quad (19)$$

Figure 7:
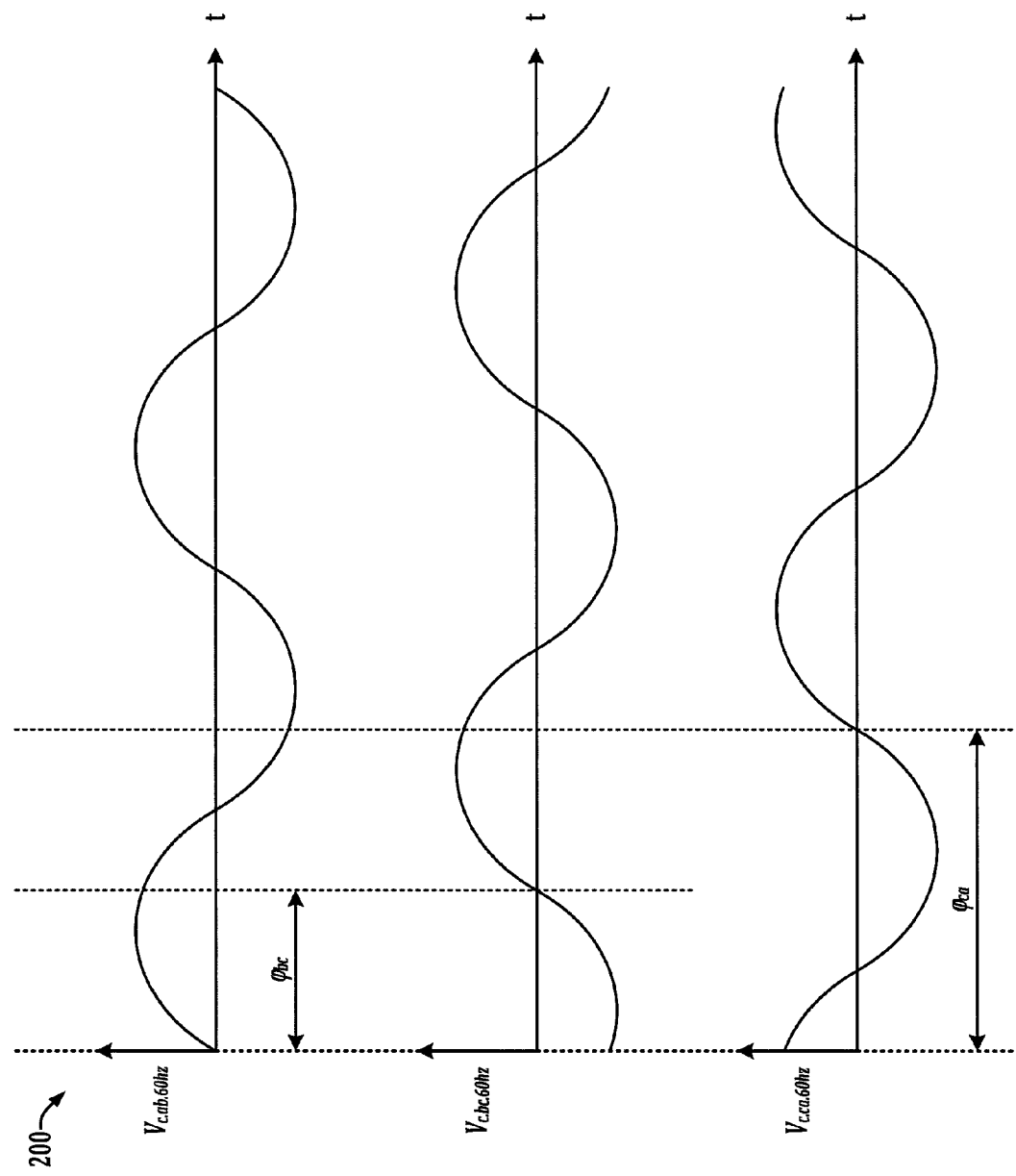
FIG. 7 is a graph showing exemplary line-to-line voltage waveforms and corresponding phase angles in the systems of FIGS. 1 and 2.

In addition, assuming the resistance value of 1 ohm, the following equations (20)-(22) can be used to express the resistor currents as a function of the measured voltages:

$$I_{ab1.60hz.real.1.rms} = V_{c.ab.60hz.rms} \quad (20)$$

$$I_{bc1.60hz.real.1.rms} = V_{c.bc.60hz.rms} \quad (21)$$

$$I_{ca1.60hz.real.1.rms} = V_{c.ca.60hz.rms} \quad (22)$$

where $\varphi_{bc}$, $\varphi_{ca}$ are the voltage phase angles in radians according to the graph 200 shown in FIG. 7. According to Kirchhoff's current law for the nodes of the artificial resistive circuit in FIG. 3, the following equations (23)-(25) can be constructed:

$$I_{a1.60hz.calc.1} = I_{ab1.60hz.real.1} - I_{ca1.60hz.real.1} \quad (23)$$

where $I_{a1\text{-}60hz.calc.1}$ is a calculated phase current with $R_{ab1} = R_{bc1} = R_{ca1} = 1$ $$I_{b1.60hz.calc.1} = I_{bc1.60hz.real.1} - I_{ab1.60hz.real.1} \quad (24)$$

where $I_{b1\text{-}60hz.calc.1}$ is a calculated phase current with $R_{ab1} = R_{bc1} = R_{ca1} = 1$ $$I_{c1.60hz.calc.1} = I_{ca1.60hz.real.1} - I_{bc1.60hz.real.1} \quad (25)$$

where $I_{c1\text{-}60hz.calc.1}$ is a calculated phase current with $R_{ab1} = R_{bc1} = R_{ca1} = 1$ Substituting equations (17)-(19) into equations (23)-(25) yields the following equations (26)-(28):

$$I_{a1.60hz.calc.1.rms} = \sqrt{[V_{c.ab.60hz.rms} - V_{c.ca.60hz.rms} \cdot \text{Cos}(\varphi_{ca})]^2 + [V_{c.ca.60hz.rms} \cdot \text{Sin}(\varphi_{ca})]^2} \quad (26)$$

$$I_{b1.60hz.calc.1.rms} = \sqrt{[V_{c.bc.60hz.rms} \cdot \text{Cos}(\varphi_{bc}) - V_{c.ab.60hz.rms}]^2 + [V_{c.bc.60hz.rms} \cdot \text{Sin}(\varphi_{bc})]^2} \quad (27)$$

$$I_{c1.60hz.calc.1.rms} = \sqrt{[V_{c.ca.60hz.rms} \cdot \text{Cos}(\varphi_{ca}) - V_{c.bc.60hz.rms} \cdot \text{Cos}(\varphi_{bc})]^2 + [V_{c.bc.60hz.rms} \cdot \text{Sin}(\varphi_{bc}) - V_{c.ca.60hz.rms} \cdot \text{Sin}(\varphi_{ca})]^2} \quad (28)$$

Equations (26)-(28) represent the RMS current values in the delta-connected resistors of the artificial network in FIG. 3. From these, the calculated currents in the legs of the delta-connected artificial resistor network can be determined according to the following equations (29)-(31):

$$I_{ab1.60hz.calc.1.rms} = \frac{1}{2} \cdot \left[ \sqrt{\begin{array}{c}[V_{c.ab.60hz.rms} - V_{c.ca.60hz.rms} \cdot \text{Cos}(\varphi_{ca})]^2 + \\ [V_{c.ca.60hz.rms} \cdot \text{Sin}(\varphi_{ca})]^2\end{array}} + \sqrt{\begin{array}{c}[V_{c.bc.60hz.rms} \cdot \text{Cos}(\varphi_{bc}) - V_{c.ab.60hz.rms}]^2 + \\ [V_{c.bc.60hz.rms} \cdot \text{Sin}(\varphi_{bc})]^2\end{array}} - \sqrt{\begin{array}{c}[V_{c.ca.60hz.rms} \cdot \text{Cos}(\varphi_{ca}) - V_{c.bc.60hz.rms} \cdot \text{Cos}(\varphi_{bc})]^2 + \\ [V_{c.bc.60hz.rms} \cdot \text{Sin}(\varphi_{bc}) - V_{c.ca.60hz.rms} \cdot \text{Sin}(\varphi_{ca})]^2\end{array}} \right] \quad (29)$$

$$I_{bc1.60hz.calc.1.rms} = \frac{1}{2} \cdot \left[ \sqrt{\begin{array}{c}[V_{c.bc.60hz.rms} \cdot \text{Cos}(\varphi_{bc}) - V_{c.ab.60hz.rms}]^2 + \\ [V_{c.bc.60hz.rms} \cdot \text{Sin}(\varphi_{bc})]^2\end{array}} + \sqrt{\begin{array}{c}[V_{c.ca.60hz.rms} \cdot \text{Cos}(\varphi_{ca}) - V_{c.bc.60hz.rms} \cdot \text{Cos}(\varphi_{bc})]^2 + \\ [V_{c.bc.60hz.rms} \cdot \text{Sin}(\varphi_{bc}) - V_{c.ca.60hz.rms} \cdot \text{Sin}(\varphi_{ca})]^2\end{array}} - \sqrt{\begin{array}{c}[V_{c.ab.60hz.rms} - V_{c.ca.60hz.rms} \cdot \text{Cos}(\varphi_{ca})]^2 + \\ [V_{c.ca.60hz.rms} \cdot \text{Sin}(\varphi_{ca})]^2\end{array}} \right] \quad (30)$$

$$I_{ca1.60hz.calc.1.rms} = \frac{1}{2} \cdot \left[ \sqrt{\begin{array}{c}[V_{c.ca.60hz.rms} \cdot \text{Cos}(\varphi_{ca}) - V_{c.bc.60hz.rms} \cdot \text{Cos}(\varphi_{bc})]^2 + \\ [V_{c.bc.60hz.rms} \cdot \text{Sin}(\varphi_{bc}) - V_{c.ca.60hz.rms} \cdot \text{Sin}(\varphi_{ca})]^2\end{array}} + \sqrt{\begin{array}{c}[V_{c.ab.60hz.rms} - V_{c.ca.60hz.rms} \cdot \text{Cos}(\varphi_{ca})]^2 + \\ [V_{c.ca.60hz.rms} \cdot \text{Sin}(\varphi_{ca})]^2\end{array}} - \sqrt{\begin{array}{c}[V_{c.bc.60hz.rms} \cdot \text{Cos}(\varphi_{bc}) - V_{c.ab.60hz.rms}]^2 + \\ [V_{c.bc.60hz.rms} \cdot \text{Sin}(\varphi_{bc})]^2\end{array}} \right] \quad (31)$$

Correction factors (ratios) can then be calculated based on the above equations, to derive the following equations (32)-(34) as follows:

$$Ratio_{ab.calc.1} = \frac{2 \cdot V_{c.ab.60hz.rms}}{\sqrt{[V_{c.ab.60hz.rms} - V_{c.ca.60hz.rms} \cdot \cos(\varphi_{ca})]^2 + [V_{c.ca.60hz.rms} \cdot \sin(\varphi_{ca})]^2} + \sqrt{[V_{c.bc.60hz.rms} \cdot \cos(\varphi_{bc}) - V_{c.ab.60hz.rms}]^2 + [V_{c.bc.60hz.rms} \cdot \sin(\varphi_{bc})]^2} - \sqrt{[V_{c.ca.60hz.rms} \cdot \cos(\varphi_{ca}) - V_{c.bc.60hz.rms} \cdot \cos(\varphi_{bc})]^2 + [V_{c.bc.60hz.rms} \cdot \sin(\varphi_{bc}) - V_{c.ca.60hz.rms} \cdot \sin(\varphi_{ca})]^2}} \quad (32)$$

$$Ratio_{bc.calc.1} = \frac{2 \cdot V_{c.bc.60hz.rms}}{\sqrt{[V_{c.bc.60hz.rms} \cdot \cos(\varphi_{bc}) - V_{c.ab.60hz.rms}]^2 + [V_{c.bc.60hz.rms} \cdot \sin(\varphi_{bc})]^2} + \sqrt{[V_{c.ca.60hz.rms} \cdot \cos(\varphi_{ca}) - V_{c.bc.60hz.rms} \cdot \cos(\varphi_{bc})]^2 + [V_{c.bc.60hz.rms} \cdot \sin(\varphi_{bc}) - V_{c.ca.60hz.rms} \cdot \sin(\varphi_{ca})]^2} - \sqrt{[V_{c.ab.60hz.rms} - V_{c.ca.60hz.rms} \cdot \cos(\varphi_{ca})]^2 + [V_{c.ca.60hz.rms} \cdot \sin(\varphi_{ca})]^2}} \quad (33)$$

$$Ratio_{ca.calc.1} = \frac{2 \cdot V_{c.ca.60hz.rms}}{\sqrt{[V_{c.ca.60hz.rms} \cdot \cos(\varphi_{ca}) - V_{c.bc.60hz.rms} \cdot \cos(\varphi_{bc})]^2 + [V_{c.bc.60hz.rms} \cdot \sin(\varphi_{bc}) - V_{c.ca.60hz.rms} \cdot \sin(\varphi_{ca})]^2} + \sqrt{[V_{c.ab.60hz.rms} - V_{c.ca.60hz.rms} \cdot \cos(\varphi_{ca})]^2 + [V_{c.ca.60hz.rms} \cdot \sin(\varphi_{ca})]^2} - \sqrt{[V_{c.bc.60hz.rms} \cdot \cos(\varphi_{bc}) - V_{c.ab.60hz.rms}]^2 + [V_{c.bc.60hz.rms} \cdot \sin(\varphi_{bc})]^2}} \quad (34)$$

Applying these ratios with respect to the leg currents flowing in the delta-connected filter capacitors Cab, Cbc, and Cca, the following equations (35)-(37) can be derived:

$$Z_{ab.60Hz} = \frac{\sqrt{[V_{c.ab.60hz.rms} - V_{c.ca.60hz.rms} \cdot \cos(\varphi_{ca})]^2 + [V_{c.ca.60hz.rms} \cdot \sin(\varphi_{ca})]^2} + \sqrt{[V_{c.bc.60hz.rms} \cdot \cos(\varphi_{bc}) - V_{c.ab.60hz.rms}]^2 + [V_{c.bc.60hz.rms} \cdot \sin(\varphi_{bc})]^2} - \sqrt{[V_{c.ca.60hz.rms} \cdot \cos(\varphi_{ca}) - V_{c.bc.60hz.rms} \cdot \cos(\varphi_{bc})]^2 + [V_{c.bc.60hz.rms} \cdot \sin(\varphi_{bc}) - V_{c.ca.60hz.rms} \cdot \sin(\varphi_{ca})]^2}}{I_{c.a.60hz.rms} + I_{c.b.60hz.rms} - I_{c.c.60hz.rms}} \quad (35)$$

$$Z_{bc.60Hz} = \frac{\sqrt{[V_{c.bc.60hz.rms} \cdot \cos(\varphi_{bc}) - V_{c.ab.60hz.rms}]^2 + [V_{c.bc.60hz.rms} \cdot \sin(\varphi_{bc})]^2} + \sqrt{[V_{c.ca.60hz.rms} \cdot \cos(\varphi_{ca}) - V_{c.bc.60hz.rms} \cdot \cos(\varphi_{bc})]^2 + [V_{c.bc.60hz.rms} \cdot \sin(\varphi_{bc}) - V_{c.ca.60hz.rms} \cdot \sin(\varphi_{ca})]^2} - \sqrt{[V_{c.ab.60hz.rms} - V_{c.ca.60hz.rms} \cdot \cos(\varphi_{ca})]^2 + [V_{c.ca.60hz.rms} \cdot \sin(\varphi_{ca})]^2}}{I_{c.b.60hz.rms} + I_{c.c.60hz.rms} - I_{c.a.60hz.rms}} \quad (36)$$

$$Z_{ca.60Hz} = \frac{\sqrt{[V_{c.ca.60hz.rms} \cdot \cos(\varphi_{ca}) - V_{c.bc.60hz.rms} \cdot \cos(\varphi_{bc})]^2 + [V_{c.bc.60hz.rms} \cdot \sin(\varphi_{bc}) - V_{c.ca.60hz.rms} \cdot \sin(\varphi_{ca})]^2} + \sqrt{[V_{c.ab.60hz.rms} - V_{c.ca.60hz.rms} \cdot \cos(\varphi_{ca})]^2 + [V_{c.ca.60hz.rms} \cdot \sin(\varphi_{ca})]^2} - \sqrt{[V_{c.bc.60hz.rms} \cdot \cos(\varphi_{bc}) - V_{c.ab.60hz.rms}]^2 + [V_{c.bc.60hz.rms} \cdot \sin(\varphi_{bc})]^2}}{I_{c.c.60hz.rms} + I_{c.a.60hz.rms} - I_{c.b.60hz.rms}} \quad (37)$$

Figure 6:
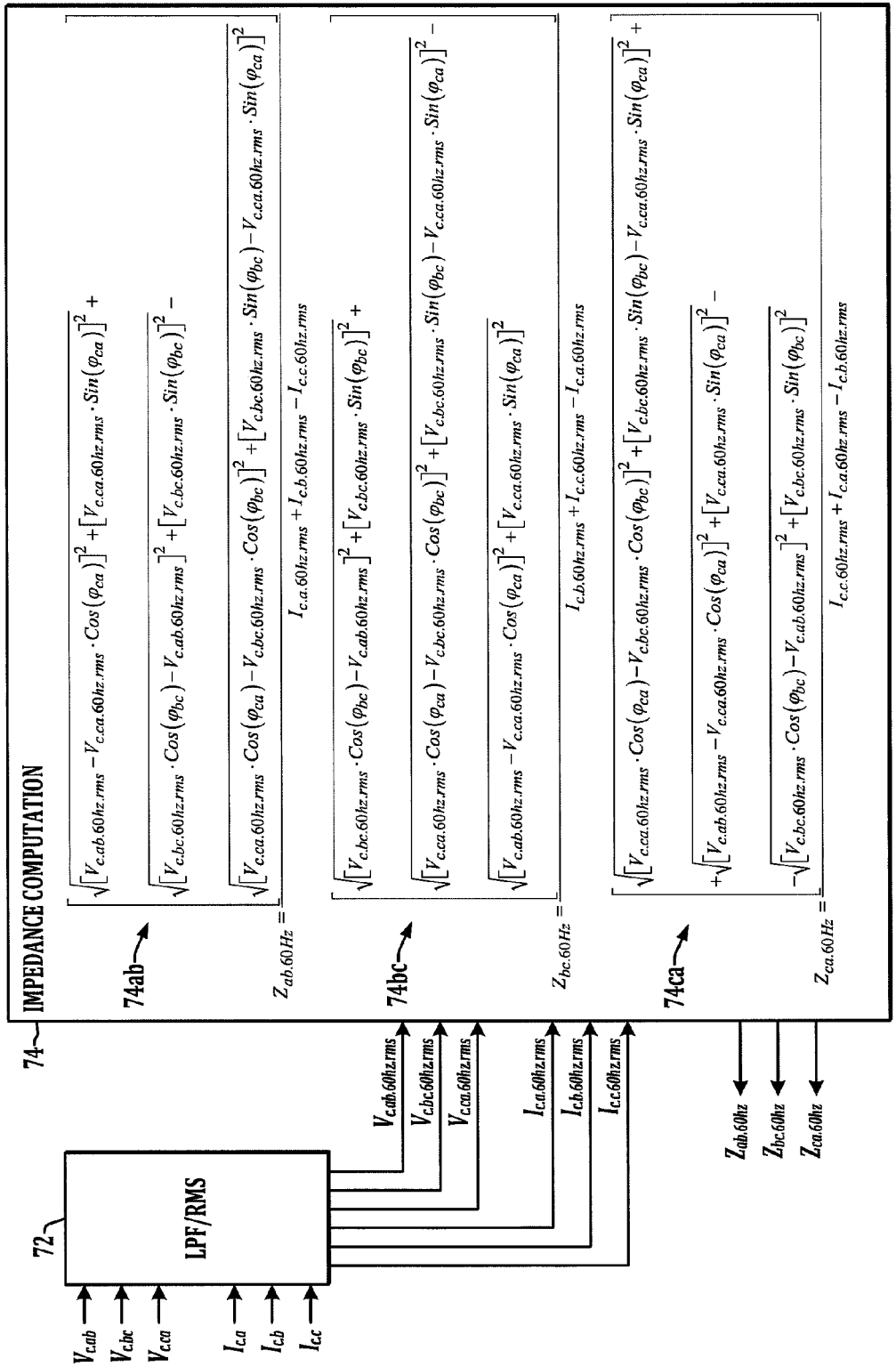
FIG. 6 is a schematic diagram illustrating further details of the exemplary impedance computation in the degradation detection apparatus of FIGS. 1 and 2.

As seen in FIG. 6, In certain embodiments, the impedance computation component 74 employs the above equations 74ab, 74bc and 74ca ((35)-(37)) to compute the fundamental frequency filter capacitor impedance values $Z_{ab.60Hz}$, $Z_{bc.60Hz}$ and $Z_{ca.60Hz}$ according to the RMS line-to-line voltages $V_{c.ab.60hz.RMS}$, $V_{c.bc.60hz.RMS}$ and $V_{c.ca.60hz.RMS}$ and according to the RMS circuit branch currents $I_{c.a.60hz.RMS}$, $I_{c.b.60hz.RMS}$ and $I_{c.c.60hz.RMS}$. Moreover, the degradation detection system 70 in certain embodiments may include a zero-crossing detection circuit operative to measure the phase angles $\Phi_{bc}$, $\Phi_{ca}$ between the line-to-line voltages $V_{c.ab}$ and $V_{c.bc}$ across the filter capacitors Cab and Cbc for use in computing the fundamental frequency filter capacitor impedance values $Z_{ab.60Hz}$, $Z_{bc.60Hz}$ and $Z_{ca.60Hz}$. In other possible implementations, the system 70 may employ assumed values of the phase angles $\Phi_{bc}$ and $\Phi_{ca}$, for example, 120° and 240°, to calculate the fundamental frequency filter capacitor impedance values $Z_{ab.60Hz}$, $Z_{bc.60Hz}$, $Z_{ca.60Hz}$ using the above equations (35)-(37). In this case, it is noted that the cosine and sine values of these angles can be precomputed as follows:

$\cos(\phi_{bc}) = \cos(\phi_{ca}) = \cos(120°) = \cos(240°) = -0.5;$ $\sin(\phi_{bc}) = \sin(120°) = 0.866;$ $\sin(\phi_{ca}) = \sin(240°) = -0.866.$ The inventors have appreciated that the described techniques are independent of voltage unbalance conditions, and are further advantageous in that individually calculated capacitor impedance values can be separately compared with one or more thresholds 76. Accordingly, a separate assessment of the relative health and/or degradation of the individual filter capacitors can be performed, allowing selective identification of which filter capacitor (if any) is degrading.

Figure 4:
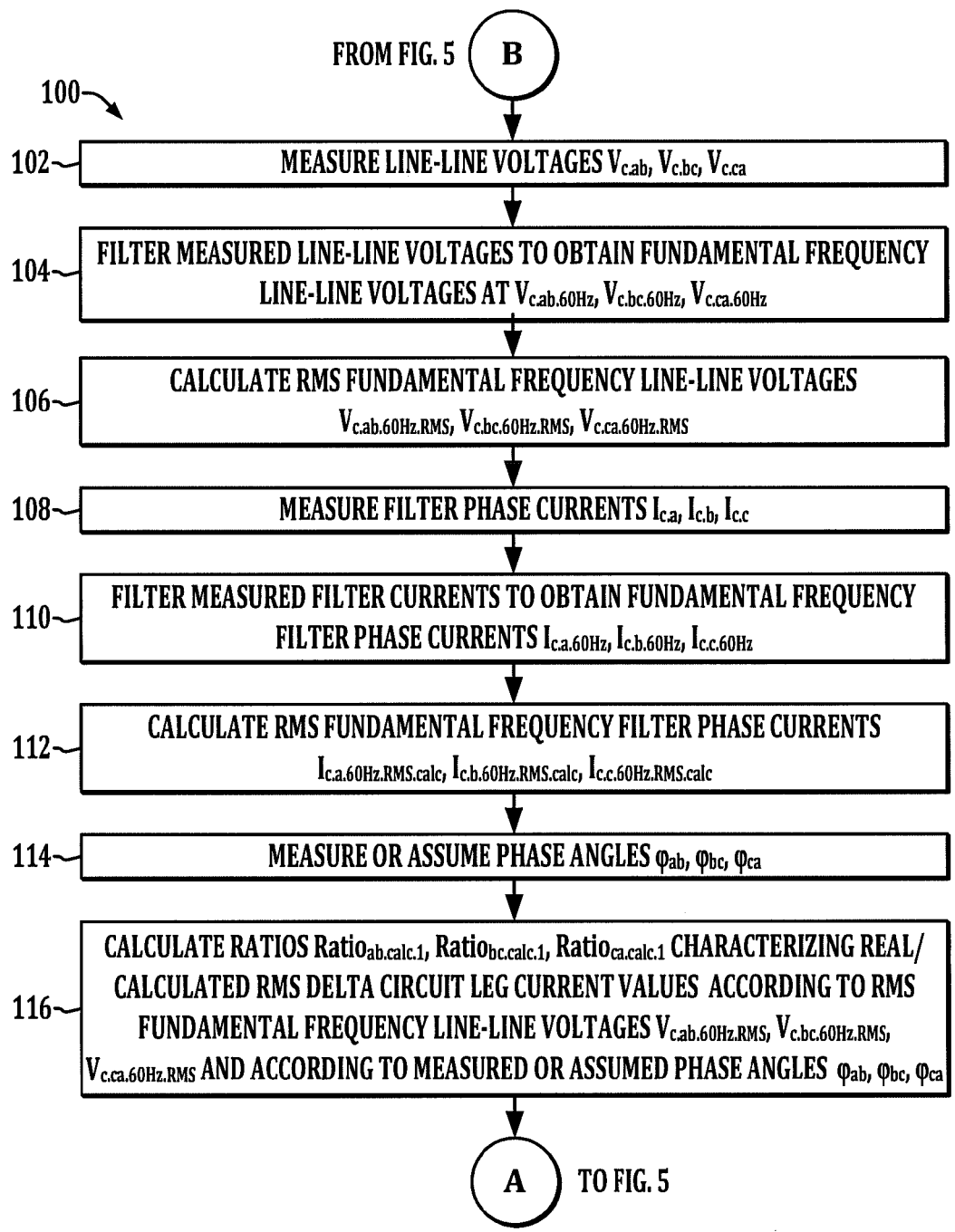
FIGS. 4 and 5 show a flow diagram illustrating an exemplary process for detecting AFE filter capacitor degradation in accordance with further aspects of the disclosure.
Figure 5:
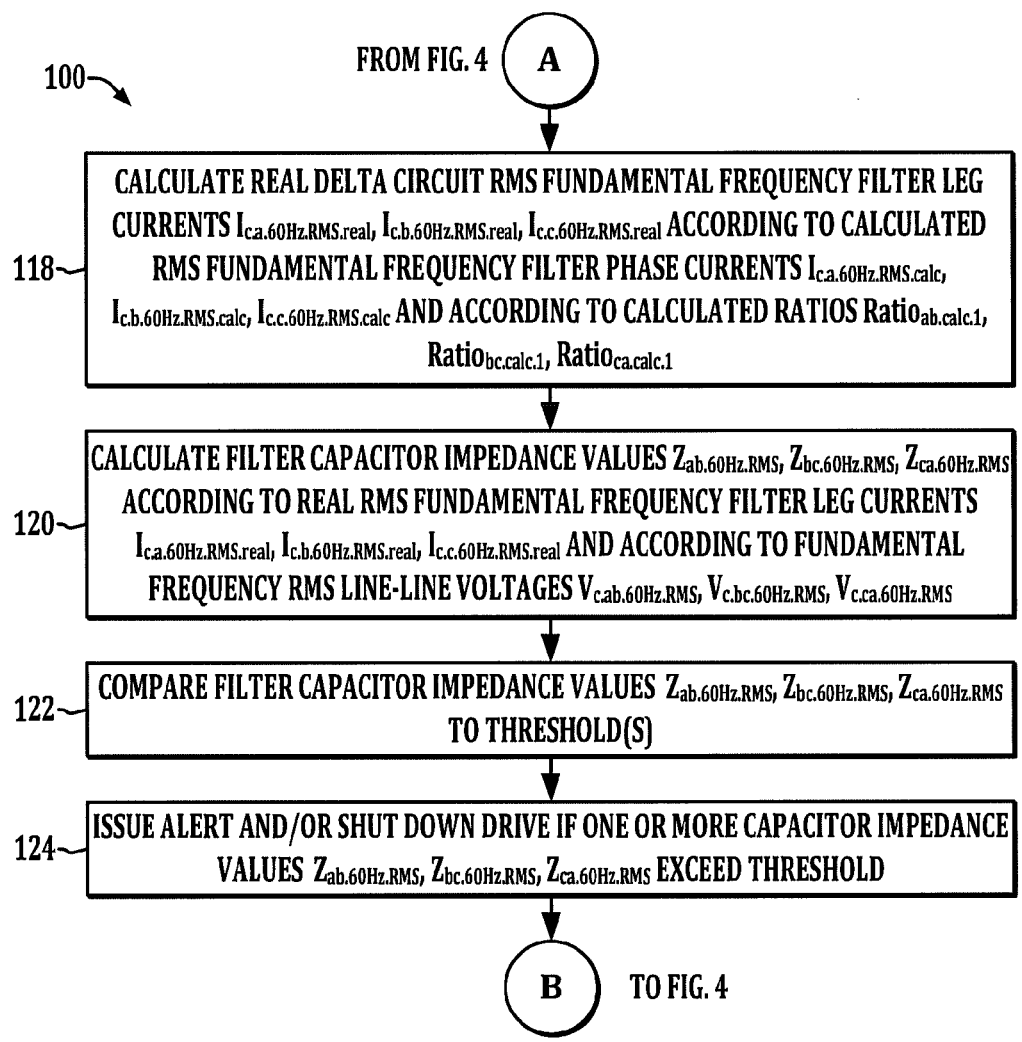

Referring also to FIGS. 4 and 5, an exemplary process 100 is illustrated for detecting filter capacitor degradation in accordance with further aspects of the present disclosure. The process 100 begins at 102 in FIG. 4, where line-to-line voltages $V_{c.ab}$, $V_{c.bc}$ and $V_{c.ca}$ across filter capacitors Cab, Cbc and Cca are measured. At 104, these measured voltages are filtered to obtain filtered line-to-line voltages $V_{c.ab.60hz}$, $V_{c.bc.60hz}$ and $V_{c.ca.60hz}$ at the fundamental frequency of the multiphase AC input power (e.g., 60 Hz). At 106, RMS line-to-line voltages $V_{c.ab.60hz.RMS}$, $V_{c.bc.60hz.RMS}$ and $V_{c.ca.60hz.RMS}$ are calculated according to the filtered line-to-line voltages $V_{c.ab.60hz}$, $V_{c.bc.60hz}$ and $V_{c.ca.60hz}$. At 108, the filter circuit branch currents $I_{c.a}$, $I_{c.b}$ and $I_{c.c}$ are measured in the capacitor circuit branches 22a, 22b, 22c, and these values are filtered at 110 and RMS values are computed at 112. At 114 in FIG. 4, the phase angles $\Phi_{bc}$, $\Phi_{ca}$ between the line-to-line voltages $V_{c.ab}$ and $V_{c.bc}$ across the filter capacitors Cab and Cbc can be measured or assumed as discussed above, and the ratios characterizing the real versus calculated RMS delta circuit leg current values can be computed according to the RMS line-to-line voltages at the fundamental frequency and the measured or assumed phase angles (e.g., ratios and equations (32)-(34) above).

As seen in FIG. 5, the process 100 further includes calculating the real delta circuit RMS filter leg currents at the fundamental frequency according to the calculated fundamental frequency currents and according to the ratios determined at 116. At 120, the fundamental frequency filter capacitor impedance values $Z_{ab.60Hz}$, $Z_{bc.60Hz}$ and $Z_{ca.60Hz}$ are calculated based at least in part on the line-to-line voltages $V_{c.ab}$, $V_{c.bc}$ and $V_{c.ca}$ and according to the filter circuit branch currents $I_{c.a}$, $I_{c.b}$ and $I_{c.c}$, and these are compared at 122 with at least one threshold 76. At 124, an alert is issued or the power converter is shut down if one or more of the capacitor impedance values exceeds the threshold(s), and the process 100 returns again to 102 in FIG. 4 as described above.

Figure 8:
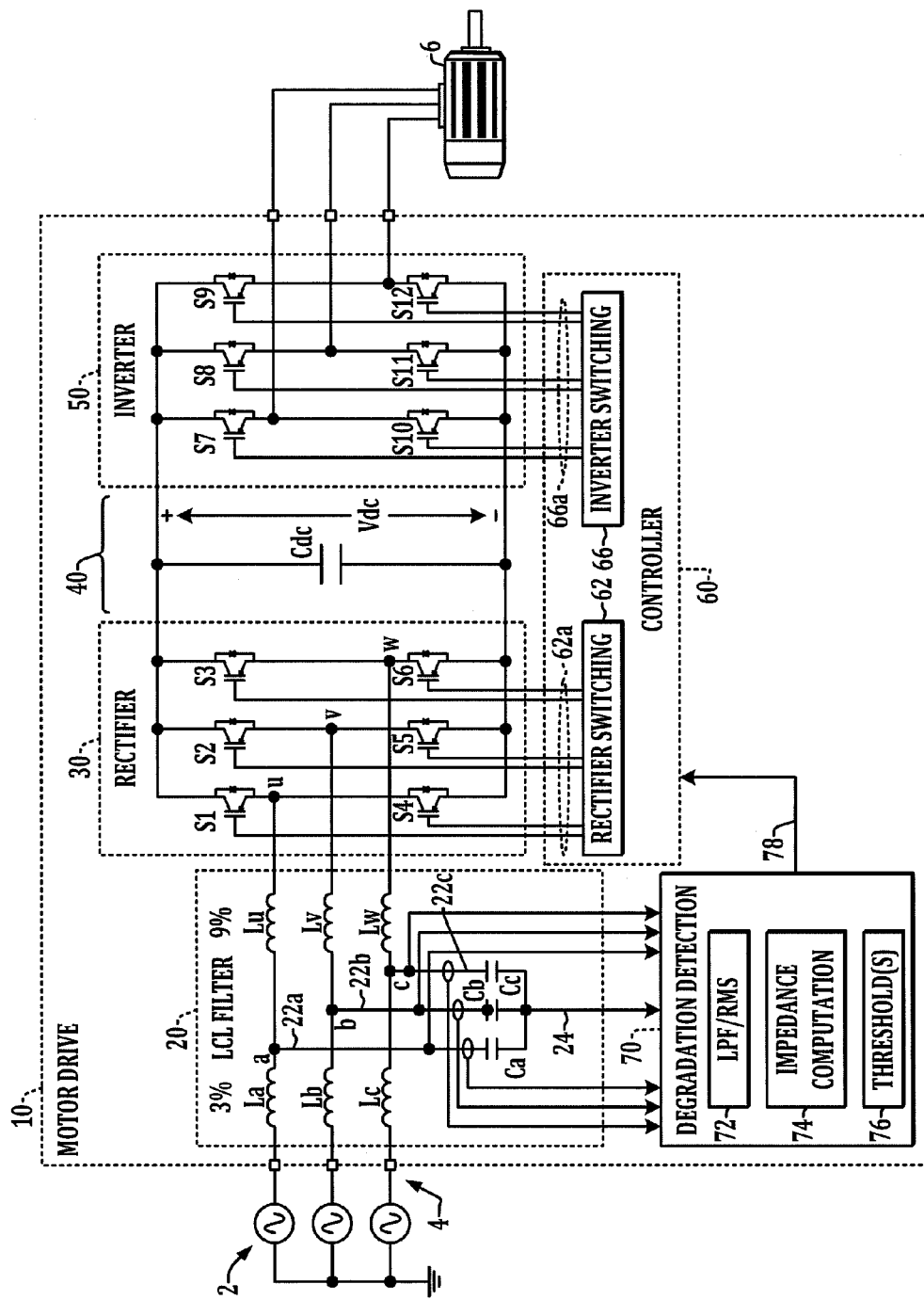
FIG. 8 is a schematic diagram illustrating another exemplary AFE motor drive with an input LCL filter with Y-connected filter capacitors, and a degradation detection system according to further aspects of the present disclosure.
Figure 9:
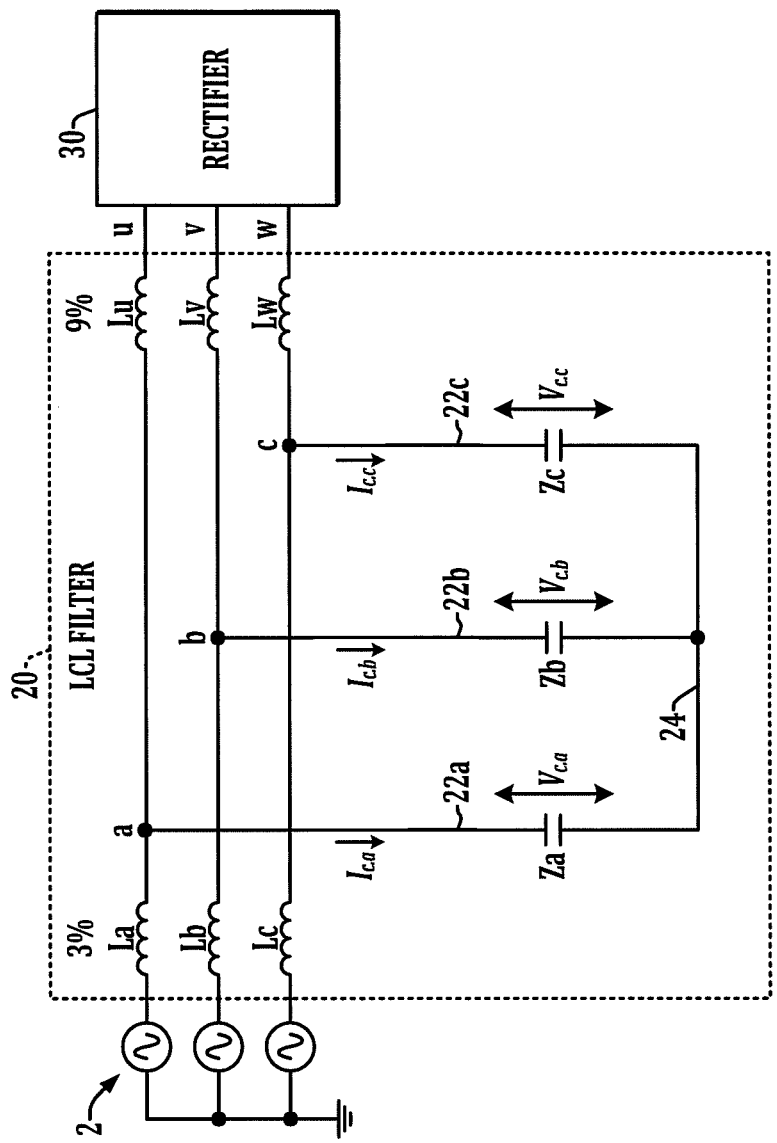
FIG. 9 is a schematic diagram further illustrating various measured and computed values in the LCL filter of FIG. 8.
Figure 10:
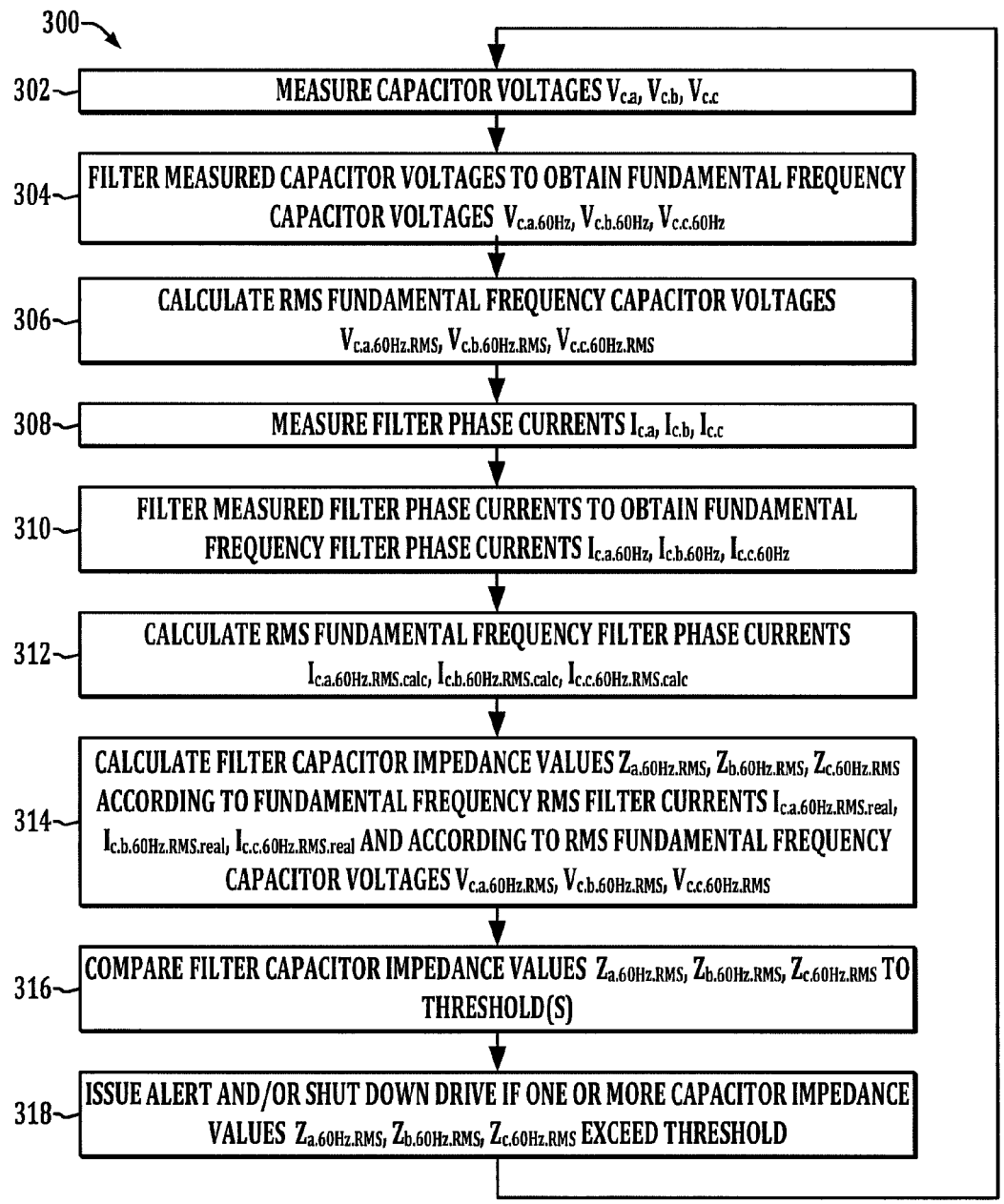
FIG. 10 is a flow diagram illustrating an exemplary process for detecting or predicting AFE filter capacitor degradation in the system of FIG. 8 and nine according to further aspects of the disclosure.

Referring also to FIGS. 8-10, another motor drive power conversion system embodiment 10 is shown in FIG. 8, with an LCL filter 20, a rectifier 30, intermediate DC link circuit 40 and inverter 50 operated by a motor drive controller 60 generally as described above to power a motor or other AC load 6 using power from an AC input source 2. In this case, however, the LCL filter 20 includes series circuits individually including two series-connected inductors (La and Lu, etc.) with corresponding capacitor circuit branches 22 connecting the series circuits with three filter capacitors Ca, Cb and Cc connected in a Y configuration with each filter capacitor C connected between a corresponding one of the capacitor circuit branches 22 and a common connection node 24. Other embodiments are possible in which only a single inductor is provided in each of the series circuits, such as where the motor drive 10 is used in combination with an input transformer (e.g., as shown in FIG. 2 above). The feedback circuit in FIGS. 8 and 9, moreover, is operative to sense capacitor voltages $V_{c.a}$, $V_{c.b}$ and $V_{c.c}$ across the filter capacitors Ca, Cb and Cc (e.g., between the corresponding node a, b or c and the common connection node 24). Also, the feedback senses the filter circuit branch currents $I_{c.a}$, $I_{c.b}$ and $I_{c.c}$ flowing in the capacitor circuit branches 22a, 22b and 22c. The filter capacitor degradation detection system 70 in this case calculates fundamental frequency filter capacitor impedance values $Z_{a.60Hz}$, $Z_{b.60Hz}$ and $Z_{c.60Hz}$ based at least partially on the capacitor voltages $V_{c.a}$, $V_{c.b}$ and $V_{c.c}$ as well as the filter circuit branch currents $I_{c.a}$, $I_{c.b}$ and $I_{c.c}$, and selectively detects degradation of one or more of the filter capacitors Ca, Cb and Cc according to the calculated fundamental frequency filter capacitor impedance values $Z_{a.60Hz}$, $Z_{b.60Hz}$ and/or $Z_{c.60Hz}$. for instance, the system 70 may individually compare the computed impedance values $Z_{a.60Hz}$, $Z_{b.60Hz}$ and $Z_{c.60Hz}$ with one or more thresholds 76 as described above in connection with FIGS. 1-5.

FIG. 10 illustrates a process 300 for filter capacitor degradation detection, which may be implemented in the system 70 of FIG. 8. At 302, the capacitor voltages $V_{c.a}$, $V_{c.b}$ and $V_{c.c}$ are measured, and these are filtered at 304, for example, using any suitable bandpass and/or low pass filtering (e.g., second order Butterworth low pass filter with a cutoff frequency of 80 Hz in one example), in order to obtain fundamental frequency capacitor voltage values $V_{c.a.60hz}$, $V_{c.b.60hz}$ and $V_{c.c.60hz}$. At 306 in FIG. 10, RMS values $V_{c.a.60hz.RMS}$, $V_{c.b.60hz.RMS}$ and $V_{c.c.60hz.RMS}$ of the fundamental frequency voltages are calculated, for example, using the above described or any other suitable RMS computation techniques. At 308, the phase currents $I_{c.a}$, $I_{c.b}$ and $I_{c.c}$ are measured, and these are filtered at 310 to obtain filtered circuit branch currents $I_{c.a.60hz}$, $I_{c.b.60hz}$ and $I_{c.c.60hz}$ at the input power fundamental frequency (e.g., 60 Hz). At 312, RMS circuit branch currents $I_{c.a.60hz.RMS}$, $I_{c.b.60hz.RMS}$ and $I_{c.c.60hz.RMS}$ are calculated according to the filtered circuit branch currents $I_{c.a.60hz}$, $I_{c.b.60hz}$ and $I_{c.c.60hz}$. The fundamental frequency filter capacitor impedance values $Z_{a.60Hz}$, $Z_{b.60Hz}$ and $Z_{c.60Hz}$ are calculated at 314 as ratios of the RMS voltages $V_{c.a.60hz.RMS}$, $V_{c.b.60hz.RMS}$ and $V_{c.c60hz.RMS}$ to the corresponding RMS currents $I_{c.a.60hz.RMS}$, $I_{c.b.60hz.RMS}$ and $I_{c.c.60hz.RMS}$ according to the following formula (38):

$$Z_{c.60Hz.RMS} = \frac{V_{c.60HZ.RMS}}{I_{c.60Hz.RMS}}. \qquad (38)$$

The inventors have appreciated that the RMS computations at 306 and 312 advantageously avoid situations where the sampled and filtered current fundamental frequency sinusoidal currents $I_{c.60hz}$ or the voltages $V_{c.a.60hz}$ pass through zero, causing the non-RMS ratio equation to become unreliable for determining the actual capacitor values. At 316 in FIG. 10, the capacitor impedance values $Z_{a.60Hz}$, $Z_{b.60Hz}$ and $Z_{c.60Hz}$ are individually compared with one or more thresholds 76, and the system 70 can issue an alert is a signal or message 78 and/or shut down the drive 10 at 318 based on the threshold comparisons.

The above embodiments and variants thereof facilitate determination of a point where one or more filter capacitors of the input filter 20 may begin to degrade, and the threshold value or values 76 can be stored in the detection system 70 in the above embodiments. In certain implementations, the threshold values 76 can be determined by the system based on an initial capacitance value measurement, and/or may be set according to manufacturer's specifications including manufacturing tolerances, temperature effects, aging effects, etc. In the illustrated embodiments, the calculated capacitor impedance values $Z_{a.60Hz}$, $Z_{b.60Hz}$ and $Z_{c.60Hz}$ are effectively compared with initial capacitance values (measured or specified) $Z_{c.a.initial}$, $Z_{c.b.initial}$, $Z_{c.c.initial}$ and the thresholds 76 can be determined relative to the initial values. For instance, the threshold values may be computed in terms of multipliers are constants multiplied by the initial impedance values. In one possible embodiment, a lower threshold is set according to a first constant (e.g., 0.9) multiplied by the initial capacitance value, and an upper threshold 76 could be 1.1 times the initial value, with the system 70 selectively issuing a detection signal 78 if the measured impedance value falls below the lower threshold or rises above the upper threshold.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A power conversion system, comprising:
a power converter input operative to receive multiphase AC input power;
an active front end (AFE) rectifier, comprising a three phase AC input, and a plurality of switching devices operative according to a plurality of rectifier switching control signals to convert power received at the three phase AC input to provide DC output power;
an input filter circuit coupled between the power converter input and the AFE rectifier, the input filter circuit comprising first, second, and third series circuits individually including at least one filter inductor coupled between a corresponding phase of the power converter input and a corresponding phase of the three phase AC input of the AFE rectifier, first, second, and third capacitor circuit branches respectively connected to the first, second and third series circuits, and three filter capacitors connected in a delta configuration with each filter capacitor connected to two of the capacitor circuit branches;
a feedback circuit operatively coupled with the input filter circuit to sense line-to-line voltages across the filter capacitors and filter circuit branch currents flowing in the capacitor circuit branches; and
a degradation detection system operatively coupled with the input filter circuit to calculate fundamental frequency filter capacitor impedance values at least partially according to the line-to-line voltages and according to the filter circuit branch currents, and to selectively detect degradation of one or more of the filter capacitors according to the calculated fundamental frequency filter capacitor impedance values.

2. The power conversion system of claim 1:
wherein the individual series circuits of the input filter circuit include a first filter inductor connected to the corresponding phase of the power converter input and a second filter inductor connected between the first filter inductor and the corresponding phase of the three phase AC input of the AFE rectifier; and
wherein the individual capacitor circuit branches of the input filter circuit are connected to a node joining the first and second filter inductors of the corresponding series circuit.

3. The power conversion system of claim 2, wherein the degradation detection system is operative to:

filter the line-to-line voltages and the filter circuit branch currents to obtain filtered line-to-line voltages and filtered circuit branch currents at a fundamental frequency of the multiphase AC input power;
calculate RMS line-to-line voltages according to the filtered line-to-line voltages;
calculate RMS circuit branch currents according to the filtered circuit branch currents; and
calculate the fundamental frequency filter capacitor impedance values according to the RMS line-to-line voltages and according to the RMS circuit branch currents.

4. The power conversion system of claim 3, wherein the degradation detection system is operative to:
calculate the fundamental frequency filter capacitor impedance value $Z_{ab.60Hz}$ of a first filter capacitor according to the following equation:

$$Z_{ab.60Hz} = \frac{\left[\begin{array}{c} \sqrt{[V_{c.ab.60hz.rms} - V_{c.ca.60hz.rms} \cdot \cos(\varphi_{ca})]^2 + [V_{c.ca.60hz.rms} \cdot \sin(\varphi_{ca})]^2} + \\ \sqrt{[V_{c.bc.60hz.rms} \cdot \cos(\varphi_{bc}) - V_{c.ab.60hz.rms}]^2 + [V_{c.bc.60hz.rms} \cdot \sin(\varphi_{bc})]^2} - \\ \sqrt{[V_{c.ca.60hz.rms} \cdot \cos(\varphi_{ca}) - V_{c.bc.60hz.rms} \cdot \cos(\varphi_{bc})]^2 + [V_{c.bc.60hz.rms} \cdot \sin(\varphi_{bc}) - V_{c.ca.60hz.rms} \cdot \sin(\varphi_{ca})]^2} \end{array}\right]}{I_{c.a.60hz.rms} + I_{c.b.60hz.rms} - I_{c.c.60hz.rms}};$$

calculate the fundamental frequency filter capacitor impedance value $Z_{bc.60Hz}$ of a second filter capacitor according to the following equation:

$$Z_{bc.60Hz} = \frac{\left[\begin{array}{c} \sqrt{[V_{c.bc.60hz.rms} \cdot \cos(\varphi_{bc}) - V_{c.ab.60hz.rms}]^2 + [V_{c.bc.60hz.rms} \cdot \sin(\varphi_{bc})]^2} + \\ \sqrt{[V_{c.ca.60hz.rms} \cdot \cos(\varphi_{ca}) - V_{c.bc.60hz.rms} \cdot \cos(\varphi_{bc})]^2 + [V_{c.bc.60hz.rms} \cdot \sin(\varphi_{bc}) - V_{c.ca.60hz.rms} \cdot \sin(\varphi_{ca})]^2} - \\ \sqrt{[V_{c.ab.60hz.rms} - V_{c.ca.60hz.rms} \cdot \cos(\varphi_{ca})]^2 + [V_{c.ca.60hz.rms} \cdot \sin(\varphi_{ca})]^2} \end{array}\right]}{I_{c.b.60hz.rms} + I_{c.c.60hz.rms} - I_{c.a.60hz.rms}};$$

and calculate the fundamental frequency filter capacitor impedance value $Z_{ca.60Hz}$ of a third filter capacitor according to the following equation:

$$Z_{ca.60Hz} = \frac{\left[\begin{array}{c} \sqrt{[V_{c.ca.60hz.rms} \cdot \cos(\varphi_{ca}) - V_{c.bc.60hz.rms} \cdot \cos(\varphi_{bc})]^2 + [V_{c.bc.60hz.rms} \cdot \sin(\varphi_{bc}) - V_{c.ca.60hz.rms} \cdot \sin(\varphi_{ca})]^2} + \\ \sqrt{[V_{c.ab.60hz.rms} - V_{c.ca.60hz.rms} \cdot \cos(\varphi_{ca})]^2 + [V_{c.ca.60hz.rms} \cdot \sin(\varphi_{ca})]^2} - \\ \sqrt{[V_{c.bc.60hz.rms} \cdot \cos(\varphi_{bc}) - V_{c.ab.60hz.rms}]^2 + [V_{c.bc.60hz.rms} \cdot \sin(\varphi_{bc})]^2} \end{array}\right]}{I_{c.c.60hz.rms} + I_{c.a.60hz.rms} - I_{c.b.60hz.rms}};$$

wherein $V_{c.ab.60hz.RMS}$, $V_{c.bc.60hz.RMS}$, and $V_{c.ca.60hz.RMS}$, are the RMS line-to-line voltages across the first, second, and third filter capacitors, respectively;

$I_{c.a.60hz.RMS}$, $I_{c.b.60hz.RMS}$, and $I_{c.c.60hz.RMS}$ are the RMS circuit branch currents flowing through the first, second, and third circuit branches, respectively; $\Phi_{bc}$ is a phase angle between the line-to-line voltages across the first and second filter capacitors; and $\Phi_{ca}$ is a phase angle between the line-to-line voltages across the first and third filter capacitors.

5. The power conversion system of claim 4, wherein the degradation detection system comprises a zero-crossing detection circuit to measure the phase angles between the line-to-line voltages across the filter capacitors.

6. The power conversion system of claim 4, wherein the degradation detection system uses assumed values of the phase angles between the line-to-line voltages across the filter capacitors to calculate the fundamental frequency filter capacitor impedance values.

7. The power conversion system of claim 1, wherein the degradation detection system is operative to:
filter the line-to-line voltages and the filter circuit branch currents to obtain filtered line-to-line voltages and filtered circuit branch currents at a fundamental frequency of the multiphase AC input power;
calculate RMS line-to-line voltages according to the filtered line-to-line voltages;
calculate RMS circuit branch currents according to the filtered circuit branch currents; and
calculate the fundamental frequency filter capacitor impedance values according to the RMS line-to-line voltages and according to the RMS circuit branch currents.

8. The power conversion system of claim 7, wherein the degradation detection system is operative to:
calculate the fundamental frequency filter capacitor impedance value $Z_{ab.60Hz}$ of a first filter capacitor according to the following equation:

$$Z_{ab.60Hz} = \frac{\sqrt{\begin{array}{c}[V_{c.ab.60hz.rms} - V_{c.ca.60hz.rms} \cdot \cos(\varphi_{ca})]^2 + \\ [V_{c.ca.60hz.rms} \cdot \sin(\varphi_{ca})]^2\end{array}} + \sqrt{\begin{array}{c}[V_{c.bc.60hz.rms} \cdot \cos(\varphi_{bc}) - V_{c.ab.60hz.rms}]^2 + \\ [V_{c.bc.60hz.rms} \cdot \sin(\varphi_{bc})]^2\end{array}} - \sqrt{\begin{array}{c}[V_{c.ca.60hz.rms} \cdot \cos(\varphi_{ca}) - V_{c.bc.60hz.rms} \cdot \cos(\varphi_{bc})]^2 + \\ [V_{c.bc.60hz.rms} \cdot \sin(\varphi_{bc}) - V_{c.ca.60hz.rms} \cdot \sin(\varphi_{ca})]^2\end{array}}}{I_{c.a.60hz.rms} + I_{c.b.60hz.rms} - I_{c.c.60hz.rms}};$$

calculate the fundamental frequency filter capacitor impedance value $Z_{bc.60Hz}$ of a second filter capacitor according to the following equation:

$$Z_{bc.60Hz} = \frac{\sqrt{\begin{array}{c}[V_{c.bc.60hz.rms} \cdot \cos(\varphi_{bc}) - V_{c.ab.60hz.rms}]^2 + \\ [V_{c.bc.60hz.rms} \cdot \sin(\varphi_{bc})]^2\end{array}} + \sqrt{\begin{array}{c}[V_{c.ca.60hz.rms} \cdot \cos(\varphi_{ca}) - V_{c.bc.60hz.rms} \cdot \cos(\varphi_{bc})]^2 + \\ [V_{c.bc.60hz.rms} \cdot \sin(\varphi_{bc}) - V_{c.ca.60hz.rms} \cdot \sin(\varphi_{ca})]^2\end{array}} - \sqrt{\begin{array}{c}[V_{c.ab.60hz.rms} - V_{c.ca.60hz.rms} \cdot \cos(\varphi_{ca})]^2 + \\ [V_{c.ca.60hz.rms} \cdot \sin(\varphi_{ca})]^2\end{array}}}{I_{c.b.60hz.rms} + I_{c.c.60hz.rms} - I_{c.a.60hz.rms}};$$

and
calculate the fundamental frequency filter capacitor impedance value $Z_{ca.60Hz}$ of a third filter capacitor according to the following equation:

$$Z_{ca.60Hz} = \frac{\sqrt{\begin{array}{c}[V_{c.ca.60hz.rms} \cdot \cos(\varphi_{ca}) - V_{c.bc.60hz.rms} \cdot \cos(\varphi_{bc})]^2 + \\ [V_{c.bc.60hz.rms} \cdot \sin(\varphi_{bc}) - V_{c.ca.60hz.rms} \cdot \sin(\varphi_{ca})]^2\end{array}} + \sqrt{\begin{array}{c}[V_{c.ab.60hz.rms} - V_{c.ca.60hz.rms} \cdot \cos(\varphi_{ca})]^2 + \\ [V_{c.ca.60hz.rms} \cdot \sin(\varphi_{ca})]^2\end{array}} - \sqrt{\begin{array}{c}[V_{c.bc.60hz.rms} \cdot \cos(\varphi_{bc}) - V_{c.ab.60hz.rms}]^2 + \\ [V_{c.bc.60hz.rms} \cdot \sin(\varphi_{bc})]^2\end{array}}}{I_{c.c.60hz.rms} + I_{c.a.60hz.rms} - I_{c.b.60hz.rms}};$$

wherein $V_{c.ab.60hz.RMS}$, $V_{c.bc.60hz.RMS}$, and $V_{c.ca.60hz.RMS}$, are the RMS line-to-line voltages across the first, second, and third filter capacitors, respectively; $I_{c.a.60hz.RMS}$, $I_{c.b.60hz.RMS}$, and $I_{c.c.60hz.RMS}$ are the RMS circuit branch currents flowing through the first, second, and third circuit branches, respectively; $\Phi_{bc}$ is a phase angle between the line-to-line voltages across the first and second filter capacitors; and $\Phi_{ca}$ is a phase angle between the line-to-line voltages across the first and third filter capacitors.

9. The power conversion system of claim 8, wherein the degradation detection system comprises a zero-crossing detection circuit to measure the phase angles between the line-to-line voltages across the filter capacitors.

10. The power conversion system of claim 8, wherein the degradation detection system uses assumed values of the phase angles between the line-to-line voltages across the filter capacitors to calculate the fundamental frequency filter capacitor impedance values.

11. A method for detecting filter capacitor degradation in an active front end (AFE) motor drive, the method comprising:
measuring line-to-line voltages across filter capacitors connected in a delta configuration with each filter capacitor connected to two of three capacitor circuit branches in a filter circuit of the motor drive;
measuring filter circuit branch currents flowing in the capacitor circuit branches;
using at least one processor, calculating fundamental frequency filter capacitor impedance values at least partially according to the line-to-line voltages and according to the filter circuit branch currents;
using the at least one processor, comparing the calculated fundamental frequency filter capacitor impedance values with at least one threshold; and
selectively detecting degradation of one or more of the filter capacitors at least partially according to the comparison of the calculated fundamental frequency filter capacitor impedance values with the at least one threshold.

12. The method of claim 11, further comprising issuing an alert or shutting down the motor drive at least partially according to the comparison of the calculated fundamental frequency filter capacitor impedance values with the at least one threshold.

13. The method of claim 12, comprising:
filtering the measured line-to-line voltages to obtain filtered line-to-line voltages at a fundamental frequency of the multiphase AC input power;
calculating RMS line-to-line voltages according to the filtered line-to-line voltages;
filtering the measured filter circuit branch currents to obtain filtered circuit branch currents at the fundamental frequency of the multiphase AC input power;

calculating RMS circuit branch currents according to the filtered circuit branch currents; and calculating the fundamental frequency filter capacitor impedance values at least partially according to the RMS line-to-line voltages and the RMS circuit branch currents.

14. The method of claim 13, comprising:

calculating the fundamental frequency filter capacitor impedance value $Z_{ab.60Hz}$ of a first filter capacitor according to the following equation:

$$Z_{ab.60Hz} = \frac{\left[\sqrt{\begin{array}{c}[V_{c.ab.60hz.rms} - V_{c.ca.60hz.rms} \cdot \text{Cos}(\varphi_{ca})]^2 + \\ [V_{c.ca.60hz.rms} \cdot \text{Sin}(\varphi_{ca})]^2\end{array}} + \sqrt{\begin{array}{c}[V_{c.bc.60hz.rms} \cdot \text{Cos}(\varphi_{bc}) - V_{c.ab.60hz.rms}]^2 + \\ [V_{c.bc.60hz.rms} \cdot \text{Sin}(\varphi_{bc})]^2\end{array}} - \sqrt{\begin{array}{c}[V_{c.ca.60hz.rms} \cdot \text{Cos}(\varphi_{ca}) - V_{c.bc.60hz.rms} \cdot \text{Cos}(\varphi_{bc})]^2 + \\ [V_{c.bc.60hz.rms} \cdot \text{Sin}(\varphi_{bc}) - V_{c.ca.60hz.rms} \cdot \text{Sin}(\varphi_{ca})]^2\end{array}}\right]}{I_{c.a.60hz.rms} + I_{c.b.60hz.rms} - I_{c.c.60hz.rms}};$$

calculating the fundamental frequency filter capacitor impedance value $Z_{bc.60Hz}$ of a second filter capacitor according to the following equation:

$$Z_{bc.60Hz} = \frac{\left[\sqrt{\begin{array}{c}[V_{c.bc.60hz.rms} \cdot \text{Cos}(\varphi_{bc}) - V_{c.ab.60hz.rms}]^2 + \\ [V_{c.bc.60hz.rms} \cdot \text{Sin}(\varphi_{bc})]^2\end{array}} + \sqrt{\begin{array}{c}[V_{c.ca.60hz.rms} \cdot \text{Cos}(\varphi_{ca}) - V_{c.bc.60hz.rms} \cdot \text{Cos}(\varphi_{bc})]^2 + \\ [V_{c.bc.60hz.rms} \cdot \text{Sin}(\varphi_{bc}) - V_{c.ca.60hz.rms} \cdot \text{Sin}(\varphi_{ca})]^2\end{array}} - \sqrt{\begin{array}{c}[V_{c.ab.60hz.rms} - V_{c.ca.60hz.rms} \cdot \text{Cos}(\varphi_{ca})]^2 + \\ [V_{c.ca.60hz.rms} \cdot \text{Sin}(\varphi_{ca})]^2\end{array}}\right]}{I_{c.b.60hz.rms} + I_{c.c.60hz.rms} - I_{c.a.60hz.rms}};$$

and calculating the fundamental frequency filter capacitor impedance value $Z_{ca.60Hz}$ of a third filter capacitor according to the following equation:

$$Z_{ca.60Hz} = \frac{\left[\sqrt{\begin{array}{c}[V_{c.ca.60hz.rms} \cdot \text{Cos}(\varphi_{ca}) - V_{c.bc.60hz.rms} \cdot \text{Cos}(\varphi_{bc})]^2 + \\ [V_{c.bc.60hz.rms} \cdot \text{Sin}(\varphi_{bc}) - V_{c.ca.6hz.rms} \cdot \text{Sin}(\varphi_{ca})]^2\end{array}} + \sqrt{\begin{array}{c}[V_{c.ab.60hz.rms} - V_{c.ca.60hz.rms} \cdot \text{Cos}(\varphi_{ca})]^2 + \\ [V_{c.ca.60hz.rms} \cdot \text{Sin}(\varphi_{ca})]^2\end{array}} - \sqrt{\begin{array}{c}[V_{c.bc.60hz.rms} \cdot \text{Cos}(\varphi_{bc}) - V_{c.ab.60hz.rms}]^2 + \\ [V_{c.bc.60hz.rms} \cdot \text{Sin}(\varphi_{bc})]^2\end{array}}\right]}{I_{c.c.60hz.rms} + I_{c.a.60hz.rms} - I_{c.b.60hz.rms}};$$

wherein $V_{c.ab.60hz.RMS}$, $V_{c.bc.60hz.RMS}$, and $V_{c.ca.60hz.RMS}$, are the RMS line-to-line voltages across the first, second, and third filter capacitors, respectively; $I_{c.a.60hz.RMS}$, $I_{c.b.60hz.RMS}$, and $I_{c.c.60hz.RMS}$ are the RMS circuit branch currents flowing through the first, second, and third circuit branches, respectively; $\Phi_{bc}$ is a phase angle between the line-to-line voltages across the first and second filter capacitors; and $\Phi_{ca}$ is a phase angle between the line-to-line voltages across the first and third filter capacitors.

15. The method of claim 11, comprising:

filtering the measured line-to-line voltages to obtain filtered line-to-line voltages at a fundamental frequency of the multiphase AC input power;

calculating RMS line-to-line voltages according to the filtered line-to-line voltages;

filtering the measured filter circuit branch currents to obtain filtered circuit branch currents at the fundamental frequency of the multiphase AC input power;

calculating RMS circuit branch currents according to the filtered circuit branch currents; and calculating the fundamental frequency filter capacitor impedance values at least partially according to the RMS line-to-line voltages and the RMS circuit branch currents.

16. The method of claim 15, comprising:

calculating the fundamental frequency filter capacitor impedance value $Z_{ab.60Hz}$ of a first filter capacitor according to the following equation:

$$Z_{ab.60Hz} = \frac{\left[\sqrt{\begin{array}{c}[V_{c.ab.60hz.rms} - V_{c.ca.60hz.rms} \cdot \text{Cos}(\varphi_{ca})]^2 + \\ [V_{c.ca.60hz.rms} \cdot \text{Sin}(\varphi_{ca})]^2\end{array}} + \sqrt{\begin{array}{c}[V_{c.bc.60hz.rms} \cdot \text{Cos}(\varphi_{bc}) - V_{c.ab.60hz.rms}]^2 + \\ [V_{c.bc.60hz.rms} \cdot \text{Sin}(\varphi_{bc})]^2\end{array}} - \sqrt{\begin{array}{c}[V_{c.ca.60hz.rms} \cdot \text{Cos}(\varphi_{ca}) - V_{c.bc.60hz.rms} \cdot \text{Cos}(\varphi_{bc})]^2 + \\ [V_{c.bc.60hz.rms} \cdot \text{Sin}(\varphi_{bc}) - V_{c.ca.60hz.rms} \cdot \text{Sin}(\varphi_{ca})]^2\end{array}}\right]}{I_{c.a.60hz.rms} + I_{c.b.60hz.rms} - I_{c.c.60hz.rms}};$$

calculating the fundamental frequency filter capacitor impedance value $Z_{bc.60Hz}$ of a second filter capacitor according to the following equation:

$$Z_{bc.60Hz} = \frac{\left[\sqrt{\begin{array}{c}[V_{c.bc.60hz.rms} \cdot \text{Cos}(\varphi_{bc}) - V_{c.ab.60hz.rms}]^2 + \\ [V_{c.bc.60hz.rms} \cdot \text{Sin}(\varphi_{bc})]^2\end{array}} + \sqrt{\begin{array}{c}[V_{c.ca.60hz.rms} \cdot \text{Cos}(\varphi_{ca}) - V_{c.bc.60hz.rms} \cdot \text{Cos}(\varphi_{bc})]^2 + \\ [V_{c.bc.60hz.rms} \cdot \text{Sin}(\varphi_{bc}) - V_{c.ca.60hz.rms} \cdot \text{Sin}(\varphi_{ca})]^2\end{array}} - \sqrt{\begin{array}{c}[V_{c.ab.60hz.rms} - V_{c.ca.60hz.rms} \cdot \text{Cos}(\varphi_{ca})]^2 + \\ [V_{c.ca.60hz.rms} \cdot \text{Sin}(\varphi_{ca})]^2\end{array}}\right]}{I_{c.b.60hz.rms} + I_{c.c.60hz.rms} - I_{c.a.60hz.rms}};$$

and calculating the fundamental frequency filter capacitor impedance value $Z_{ca.60Hz}$ of a third filter capacitor according to the following equation:

$$Z_{ca.60Hz} = \frac{\left[\begin{array}{c}\sqrt{\begin{array}{c}[V_{c.ca.60hz.rms}\cdot\text{Cos}(\varphi_{ca}) - V_{c.bc.60hz.rms}\cdot\text{Cos}(\varphi_{bc})]^2 + \\ [V_{c.bc.60hz.rms}\cdot\text{Sin}(\varphi_{bc}) - V_{c.ca.60hz.rms}\cdot\text{Sin}(\varphi_{ca})]^2\end{array}} + \\ \sqrt{\begin{array}{c}[V_{c.ab.60hz.rms} - V_{c.ca.60hz.rms}\cdot\text{Cos}(\varphi_{ca})]^2 + \\ [V_{c.ca.60hz.rms}\cdot\text{Sin}(\varphi_{ca})]^2\end{array}} - \\ \sqrt{\begin{array}{c}[V_{c.bc.60hz.rms}\cdot\text{Cos}(\varphi_{bc}) - V_{c.ab.60hz.rms}]^2 + \\ [V_{c.bc.60hz.rms}\cdot\text{Sin}(\varphi_{bc})]^2\end{array}}\end{array}\right]}{I_{c.c.60hz.rms} + I_{c.a.60hz.rms} - I_{c.b.60hz.rms}};$$

wherein $V_{c.ab.60hz.RMS}$, $V_{c.bc.60hz.RMS}$, and $V_{c.ca.60hz.RMS}$, are the RMS line-to-line voltages across the first, second, and third filter capacitors, respectively; $I_{c.a.60hz.RMS}$, $I_{c.b.60hz.RMS}$, and $I_{c.c.60hz.RMS}$ are the RMS circuit branch currents flowing through the first, second, and third circuit branches, respectively; $\Phi_{bc}$ is a phase angle between the line-to-line voltages across the first and second filter capacitors; and $\Phi_{ca}$ is a phase angle between the line-to-line voltages across the first and third filter capacitors.

17. A power conversion system, comprising:
a power converter input operative to receive multiphase AC input power;
an active front end (AFE) rectifier, comprising a three phase AC input, and a plurality of switching devices operative according to a plurality of rectifier switching control signals to convert power received at the three phase AC input to provide DC output power;
an input filter circuit coupled between the power converter input and the AFE rectifier, the input filter circuit comprising first, second, and third series circuits individually including at least one filter inductor coupled between a corresponding phase of the power converter input and a corresponding phase of the three phase AC input of the AFE rectifier, first, second, and third capacitor circuit branches respectively connected to the first, second and third series circuits, and three filter capacitors connected in a Y configuration with each filter capacitor connected between a corresponding one of the capacitor circuit branches and a common connection node;
a feedback circuit operatively coupled with the input filter circuit to sense capacitor voltages across the filter capacitors and filter circuit branch currents flowing in the capacitor circuit branches; and
a degradation detection system operatively coupled with the input filter circuit to calculate fundamental frequency filter capacitor impedance values at least partially according to the capacitor voltages and according to the filter circuit branch currents, and to selectively detect degradation of one or more of the filter capacitors according to the calculated fundamental frequency filter capacitor impedance values.

18. The power conversion system of claim 17:
wherein the individual series circuits of the input filter circuit include a first filter inductor connected to the corresponding phase of the power converter input and a second filter inductor connected between the first filter inductor and the corresponding phase of the three phase AC input of the AFE rectifier; and
wherein the individual capacitor circuit branches of the input filter circuit are connected to a node joining the first and second filter inductors of the corresponding series circuit.

19. The power conversion system of claim 17, wherein the degradation detection system is operative to:
filter the measured capacitor voltages and the filter circuit branch currents to obtain filtered capacitor voltages and filtered circuit branch currents at a fundamental frequency of the multiphase AC input power;
calculate RMS capacitor voltages according to the filtered line-to-line voltages;
calculate RMS circuit branch currents according to the filtered circuit branch currents; and
calculate the fundamental frequency filter capacitor impedance values according to the RMS capacitor voltages and according to the RMS circuit branch currents.

20. The power conversion system of claim 19, wherein the degradation detection system is operative to calculate the individual fundamental frequency filter capacitor impedance values $Z_{a.60Hz}$, $Z_{b.60Hz}$ and $Z_{c.60Hz}$ as ratios of the RMS capacitor voltages $V_{c.a.60hz.RMS}$, $V_{c.b.60hz.RMS}$ and $V_{c.c.60hz.RMS}$ to the corresponding RMS circuit branch currents $I_{c.a.60hz.RMS}$, and V $I_{c.b.60hz.RMS}$ and $I_{c.c.60hz.RMS}$ according to the following formula:

$$Z_{c.60Hz.RMS} = \frac{V_{c.60HZ.RMS}}{I_{c.60Hz.RMS}}.$$

* * * * *